United States Patent
Choi et al.

(10) Patent No.: US 11,122,696 B2
(45) Date of Patent: Sep. 14, 2021

(54) FLEXIBLE DISPLAY DEVICE

(71) Applicant: LG ELECTRONICS INC., Seoul (KR)

(72) Inventors: Jin Young Choi, Bucheon-si (KR); Won Seok Joo, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/865,751

(22) Filed: May 4, 2020

(65) Prior Publication Data

US 2021/0185834 A1 Jun. 17, 2021

(30) Foreign Application Priority Data

Dec. 13, 2019 (WO) ............... PCT/KR2019/017740

(51) Int. Cl.
  *H05K 5/00* (2006.01)
  *H05K 5/02* (2006.01)
  *H05K 5/03* (2006.01)

(52) U.S. Cl.
  CPC ......... *H05K 5/0017* (2013.01); *H05K 5/0213* (2013.01); *H05K 5/03* (2013.01)

(58) Field of Classification Search
  None
  See application file for complete search history.

(56) References Cited

U.S. PATENT DOCUMENTS

| 9,348,450 | B1* | 5/2016 | Kim | G06F 1/1681 |
| 2011/0063783 | A1* | 3/2011 | Shim | G06F 1/1681 |
| | | | | 361/679.01 |
| 2017/0010634 | A1* | 1/2017 | Ahn | H04M 1/0216 |
| 2017/0265317 | A1* | 9/2017 | Sun | H05K 5/0017 |
| 2018/0317333 | A1* | 11/2018 | Bl | G02F 1/13 |
| 2020/0020255 | A1* | 1/2020 | Yoon | H05K 5/0017 |
| 2020/0253069 | A1* | 8/2020 | Cha | G09F 9/301 |

FOREIGN PATENT DOCUMENTS

| KR | 10-2002-0050062 A | 6/2002 |
| KR | 10-2017-0005929 A | 1/2017 |
| KR | 10-2017-0075693 A | 7/2017 |
| KR | 10-2019-0039394 A | 4/2019 |
| KR | 10-2019-0090522 A | 8/2019 |
| KR | 10-2006300 B1 | 8/2019 |

* cited by examiner

*Primary Examiner* — Xanthia C Cunningham

(74) *Attorney, Agent, or Firm* — Birch, Stewart, Kolasch & Birch, LLP

(57) ABSTRACT

A flexible display device including a body; a flexible display exposed to an outside of the body and including a first curved surface portion curved about a first curvature center line and a first surface portion extending from the first curved surface portion, the first surface portion being disposed on a front surface of the body; a first support portion and a second support portion disposed on opposite sides of the flexible display in a direction parallel to the first curvature center line; and a first protective guard moveably coupled to the first and second support portions and protecting the first curved surface portion of the flexible display.

20 Claims, 24 Drawing Sheets

FLEXIBLE DISPLAY DEVICE

CROSS-REFERENCE TO RELATED APPLICATION

Pursuant to 35 U.S.C. § 119, this application claims the benefit of priority to PCT International Application No. PCT/KR2019/017740 filed on Dec. 13, 2019, the contents of which are all hereby incorporated by reference herein in its entirety.

BACKGROUND OF THE INVENTION

Field of the Invention

The present disclosure relates to a display device in which at least a portion of a flexible display is formed to be curved.

Discussion of the Related Art

With the development of flexible displays that are bendable while displaying image information thereon, devices including a flexible display, which forms a flat surface and a curved surface, are being developed. As one example of these devices, Korean Patent Application Publication No. 10-2019-0090522 discloses a "Mobile Terminal", which includes a display having curved surfaces formed at the left end portion and the right end portion thereof. That is, a portion of the display forms a flat surface, and the remaining portion of the display forms a curved surface.

In addition, foldable devices including a flexible display and two bodies folded and unfolded from each other have been developed. Such foldable devices are classified into an in-folding type, in which a flexible display is located on the inner sides of two bodies when the two bodies are folded over each other, and an out-folding type, in which a flexible display is located on the outer sides of two bodies when the two bodies are folded over each other.

When the two bodies of a foldable device are folded over each other, a portion of a flexible display forms a curved surface. Further, as another exemplary device using a flexible display, a rollable device, which is configured such that a portion of a flexible device that forms a curved surface is variable, has been developed. In a rollable device, at least a portion of a flexible display can be rolled in a circular shape and unrolled, or the position of the portion that is curved to form a curved surface can be changed.

In general, in these display devices, a portion of a flexible display that corresponds to a curved surface forms an edge portion of a display device. However, such an edge portion of a display device is vulnerable to damage upon contact with an external object or external impact. In particular, in a device including a display that is variable (for example, a foldable device, a rollable device, etc.), it is difficult to protect the outer surface of a curved portion of a flexible display using glass or the like, which has a relatively high degree of hardness, and thus the risk of damage to the curved portion of the flexible display can increase.

SUMMARY OF THE INVENTION

Accordingly, one aspect of the present disclosure is to provide a flexible display device having a protective structure for shielding and protecting a curved surface portion of a flexible display or exposing the curved surface portion.

Another aspect of the present disclosure is to provide a flexible display device to which a protective structure for protecting a curved surface portion of a flexible display is detachably mounted.

A further aspect of the present disclosure is to provide a flexible display device in which the position of a protective structure can be fixed so as to shield a specific region of a curved surface portion of a flexible display and can also be easily changed.

Still another aspect of the present disclosure is to provide a flexible display device having a protective structure for shielding and protecting different regions of a curved surface portion of a flexible display.

Still another aspect of the present disclosure is to provide a flexible display device having a structure for preventing foreign substances from entering the device.

To achieve these and other aspects, the flexible display device according to an embodiment of the present disclosure includes a body, a flexible display, and a first protective guard.

At least a portion of the flexible display may be exposed to the outside of the body, and may include a first curved surface portion and a first surface portion.

The first curved surface portion may form an outer surface that is curved about a first curvature center line.

The first surface portion may form an outer surface that is parallel to the first curvature center line. The first surface portion may be a surface extending from the first curved surface portion.

The first surface portion may form an outer surface that is flat and extends from the first curved surface portion, and may be disposed on the front surface of the body.

The flexible display device according to the embodiment of the present disclosure may include a first support portion and a second support portion.

The first support portion and the second support portion may be provided separately from each other, and may be fixed to the body. The first support portion and the second support portion may be respectively disposed on the two opposite sides of the first curved surface portion in a direction parallel to the first curvature center line.

The first protective guard may include a first connection plate, a second connection plate, and a first protective plate.

The first protective plate may extend in the direction parallel to the first curvature center line, and may be disposed outside the flexible display. The first protective plate may connect the first connection plate and the second connection plate to each other.

The first connection plate may be movably coupled to the first support portion. The first connection plate may be coupled to the body so as to be rotatable about a first rotation axis. The first connection plate may be coupled to the first support portion so as to be rotatable about the first rotation axis. The first connection plate may be formed to be bent at one end portion of the first protective plate.

The second connection plate may be movably coupled to the second support portion. The second connection plate may be coupled to the body so as to be rotatable about the first rotation axis. The second connection plate may be coupled to the second support portion so as to be rotatable about the first rotation axis. The second connection plate may be formed to be bent at the opposite end portion of the first protective plate.

In the flexible display device according to the embodiment of the present disclosure, the first protective guard, which is movable relative to the first support portion and the second support portion, may function as a protective structure for protecting the flexible display, and may shield or expose at least a portion of the first curved surface portion.

The first support portion and the second support portion may be disposed at positions further outward than the two opposite edges of the first curved surface portion so as to be symmetrical to each other.

The vertical distance from the first curvature center line to the edge of the first support portion may be greater than the radius of curvature of the first curved surface portion.

The first protective guard may be coupled to the first support portion and the second support portion so as to be rotatable about a first rotation axis.

The first rotation axis may be formed in the same line as the first curvature center line.

The first protective plate may include a curved inner surface, and the curved inner surface of the first protective plate may be concentric with the first curved surface portion.

The angle that the first curved surface portion forms about the first curvature center line may be 180°, and the angle that the first protective plate forms about the first rotation axis may be any angle within a range from 30° to 120°.

The flexible display device according to the embodiment of the present disclosure may include an extended protective guard.

The extended protective guard may include an extended protective plate, a first extended connection plate, and a second extended connection plate.

The extended protective plate may extend in the direction parallel to the first curvature center line, and may be disposed outside the flexible display. The extended protective plate may connect the first extended connection plate and the second extended connection plate to each other.

The first extended connection plate may be movably coupled to the first support portion. The first extended connection plate may be formed to be bent at one end portion of the extended protective plate.

The second extended connection plate may be movably coupled to the second support portion. The second extended connection plate may be formed to be bent at the opposite end portion of the extended protective plate.

In the flexible display device according to the embodiment of the present disclosure, the extended protective guard, which is movable relative to the first support portion and the second support portion, may function as a protective structure for protecting the flexible display, and may shield or expose at least a portion of the first curved surface portion.

The first protective guard and the extended protective guard may be movable relative to each other, and may at least partially overlap each other.

The first protective guard and the extended protective guard may be coupled to the first support portion and the second support portion so as to be rotatable about the first rotation axis.

The first protective guard may be provided with a first latching protrusion, and the extended protective guard may be provided with a second latching protrusion configured to be caught on the first latching protrusion.

The flexible display may include a second surface portion forming an outer surface that is opposite the first surface portion.

The second surface portion may be a surface that extends from the first curved surface portion.

The flexible display device according to the embodiment of the present disclosure may include a first plate and a second plate, which are respectively disposed at positions further outward than the two opposite edges of each of the first surface portion and the second surface portion in the direction parallel to the first curvature center line.

The first plate and the second plate may protrude further outward than the first surface portion and the second surface portion in the direction orthogonal to surfaces of the first surface portion and the second surface portion.

The flexible display device according to the embodiment of the present disclosure may further include a base through which the first support portion and the first connection plate are coupled to each other.

Any one of the first connection plate or the base may be provided with a fastening protrusion, and the remaining one of the first connection plate or the base may be provided with a first fastening ring into which the fastening protrusion is inserted.

The outer circumferential surface of the fastening protrusion and the inner circumferential surface of the first fastening ring, configured to at least partially contact each other, may be formed in a polygonal shape.

In the flexible display device according to the embodiment of the present disclosure, the fastening protrusion may be formed at the base, and the first fastening ring may be formed at the first connection plate.

The first support portion may have a seating recess formed in the outer surface thereof, into which the base is detachably inserted.

The flexible display device according to the embodiment of the present disclosure may include a cap.

The cap may include a flange having a diameter larger than the inner diameter of the first fastening ring and a fixing protrusion protruding from the center of the flange to be attached to and detached from the fastening protrusion.

The flexible display device according to the embodiment of the present disclosure may include a rotary body, a stop ball, an elastic body, and a cylinder.

The rotary body may include a neck portion secured to the first connection plate and extending inward along the first rotation axis, and a head portion formed so as to expand in diameter from the inner end of the neck portion, the head portion including a plurality of concave stop recesses formed therein and arranged in the circumferential direction about the first rotation axis.

The stop ball may be configured to be inserted into any one of the stop recesses.

The elastic body may be configured to elastically support the stop ball such that the stop ball is inserted into any one of the stop recesses.

The cylinder may be coupled to the interior of the body, and may be configured to accommodate and support the stop ball and the elastic body.

The flexible display may include a second curved surface portion.

The second curved surface portion may be configured to form an outer surface that is curved about a second curvature center line parallel to the first curvature center line, and may be formed to be convex in the direction opposite the first curved surface portion.

The flexible display device according to the embodiment of the present disclosure may include a third support portion, a fourth support portion, and a second protective guard.

The third support portion and the fourth support portion may be provided separately from each other, and may be fixed to the body. The third support portion and the fourth support portion may be respectively disposed on the two opposite sides of the second curved surface portion in the direction parallel to the second curvature center line.

The second protective guard may include a second protective plate, a third connection plate, and a fourth connection plate.

The second protective plate may extend in the direction parallel to the second curvature center line, and may be disposed outside the flexible display. The second protective plate may connect the third connection plate and the fourth connection plate to each other.

The third connection plate may be coupled to the body so as to be rotatable about a second rotation axis. The third connection plate may be coupled to the third support portion so as to be rotatable about the second rotation axis. The third connection plate may be formed to be bent at one end portion of the second protective plate.

The fourth connection plate may be coupled to the body so as to be rotatable about the second rotation axis. The fourth connection plate may be coupled to the fourth support portion so as to be rotatable about the second rotation axis. The fourth connection plate may be formed to be bent at the opposite end portion of the second protective plate.

In the flexible display device according to the embodiment of the present disclosure, the second protective guard, which is rotatable relative to the third support portion and the fourth support portion, may function as a protective structure for protecting the flexible display, and may shield or expose at least a portion of the second curved surface portion.

The flexible display device according to the embodiment of the present disclosure may include a back cover and a first filter.

The back cover may be configured to shield the second surface portion while being spaced apart therefrom.

The first filter may include at least one of a brush, a cloth, a nonwoven fabric, a sponge, or paper, and may be coupled to the inner surface of the back cover so as to be in contact with the flexible display.

The flexible display device according to the embodiment of the present disclosure may include a second filter.

The second filter may include at least one of a brush, a cloth, a nonwoven fabric, a sponge, or paper, and may be coupled to the inner surface of the first protective guard so as to be in contact with the flexible display.

The flexible display device according to embodiments of the present disclosure may include a first protective guard for shielding or exposing at least a portion of a first curved surface portion, and may further include a second protective guard, thereby effectively protecting a curved surface portion of a flexible display.

The flexible display device according to the embodiments of the present disclosure may include a base and a cap, and a first protective guard may be easily mounted to or detached from the flexible display device.

The flexible display device according to the embodiments of the present disclosure may include a fastening protrusion and a first fastening ring. The outer circumferential surface of the fastening protrusion and the inner circumferential surface of the first fastening ring may be formed in a polygonal shape. In addition, the flexible display device according to an embodiment of the present disclosure may include a rotary body, a stop ball, an elastic body, and a cylinder. Accordingly, the position of a first protective guard may be fixed so as to shield a specific region of a flexible display, and may also be easily changed.

The flexible display device according to the embodiments of the present disclosure may include a first protective guard and an extended protective guard. The first protective guard and the extended protective guard may be configured to rotate relative to each other and to at least partially overlap each other. Accordingly, the first protective guard and the extended protective guard may shield and protect different regions of a first curved surface portion of a flexible display.

The flexible display device according to the embodiments of the present disclosure may include a first filter and a second filter. Accordingly, it is possible to prevent foreign substances from entering the device.

BRIEF DESCRIPTION OF THE DRAWINGS

The above and other aspects, features, and advantages of the present disclosure will become apparent from the detailed description of the following aspects in conjunction with the accompanying drawings, in which.

DETAILED DESCRIPTION OF THE EMBODIMENTS

Figure 1:
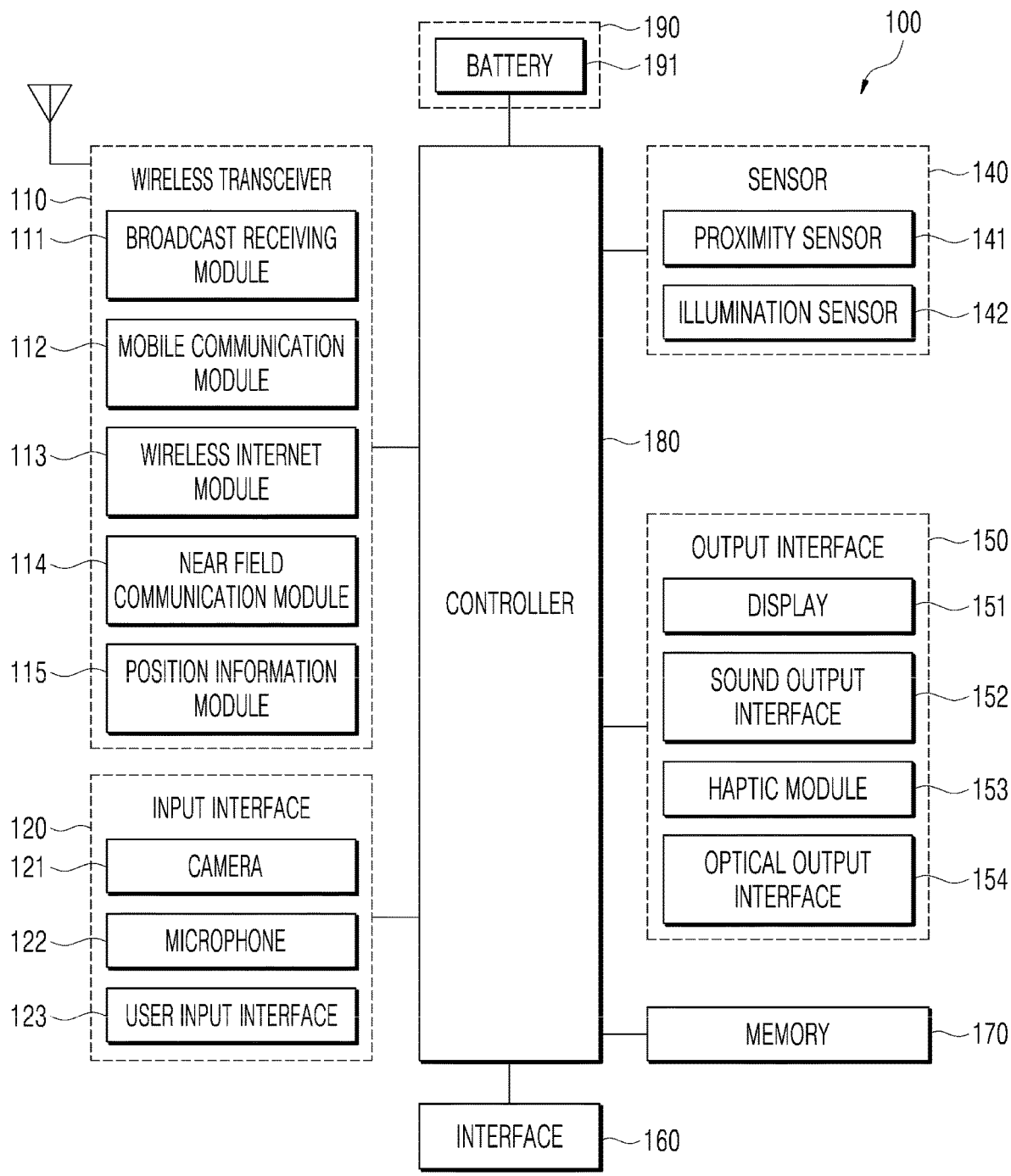
FIG. 1 is a block diagram illustrating a flexible display device according to an embodiment of the present disclosure.

Hereinafter, exemplary embodiments of the present disclosure will be described in detail with reference to accompanying drawings, and the same or similar elements are designated with the same numeral references regardless of numerals in the drawings and their redundant description will be omitted. As used herein, the terms "module" and "unit" used to refer to components are used interchangeably in consideration of convenience of explanation, and thus, the terms per se should not be considered as having different meanings or functions. The accompanying drawings are merely used to help easily understand embodiments of the present disclosure, and it should be understood that the technical idea of the present disclosure is not limited by the accompanying drawings, and these embodiments include all changes, equivalents or alternatives within the idea and the technical scope of the present disclosure.

Although the terms first, second, third, and the like can be used herein to describe various elements, components, regions, layers, and/or sections, these elements, components, regions, layers, and/or sections should not be limited by these terms. These terms are generally only used to distinguish one element from another.

When an element or layer is referred to as being "on," "engaged to," "connected to," or "coupled to" another element or layer, it can be directly on, engaged, connected, or coupled to the other element or layer, or intervening elements or layers can be present. In contrast, when an element is referred to as being "directly on," "directly engaged to," "directly connected to," or "directly coupled to" another element or layer, there can be no intervening elements or layers present.

As used herein, the articles "a," "an," and "the," include plural referents unless the context clearly dictates otherwise. It should be understood that the terms "comprises," "comprising," "includes," "including," "containing," "has," "having" or any other variation thereof specify the presence of stated features, integers, steps, operations, elements, and/or components, but do not preclude the presence or addition of one or more other features, integers, steps, operations, elements, and/or components.

A flexible display device (hereinafter, referred to as a 'display device') described in the present specification can include a mobile terminal such as a portable phone, a smart phone, a laptop computer, a digital broadcasting terminal, a personal digital assistant (PDA), a portable multimedia player (PMP), a navigation, a slate PC, a tablet PC, an ultrabook, a wearable device, a smartwatch, a smart glass, a head mounted display (HMD), and the like.

It will be apparent to those skilled in the art that the configuration according to the embodiment disclosed in the present specification can be applied to a fixed terminal such as a digital TV, a desktop computer, a digital signage except for an example that is applied only to a mobile terminal. Hereinafter, in the present disclosure, for the convenience of description, the mobile terminal will be first described as an example of the display device.

FIG. 1 is a block diagram illustrating explaining a mobile terminal 100 according to the present disclosure. The mobile terminal 100 includes a wireless transceiver 110, an input interface 120, a sensor 140, an output interface 150, an interface 160, a memory 170, a controller 180, and a power supply 190. The components shown in FIG. 1 are not essential to implement the mobile terminal, and the mobile terminal described in the present disclosure can include more or fewer components than the components described above.

More specifically, the wireless transceiver 110 can include one or more modules which enable wireless communication between the mobile terminal 100 and a wireless communication system, between the mobile terminal 100 and another mobile terminal 100, or between the mobile terminal 100 and an external server. Further, the wireless transceiver 110 can include one or more modules which connect the mobile terminal 100 to one or more networks.

The wireless transceiver 110 can include at least one of a broadcast receiving module 111, a mobile communication module 112, a wireless internet module 113, a near field communication module 114, or a position information module 115.

The input interface 120 can include a camera 121 or an image input interface which inputs an image signal, a microphone 122 or an audio input interface which inputs an audio signal, and a user input interface 123 (for example, a touch key or a mechanical key) which receives information from a user. Voice data or image data collected by the input unit 120 can be analyzed and processed as a control command of the user.

The sensor 140 can include one or more sensors which sense at least one of information in the mobile terminal, surrounding environment information around the mobile terminal, or user information. For example, the sensor 140 can include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (for example, a camera 121 or a microphone 122), a battery gauge, an environment sensor (for example, a barometer, a hygrometer, a thermometer, a radiation sensor, a thermal sensor, a gas sensor, etc.), or a chemical sensor (for example, an electronic nose, a healthcare sensor, and a biometric sensor). Further, the mobile terminal disclosed in the present specification can combine and utilize information sensed by at least two sensors from the above-mentioned sensors.

The output interface 150 generates outputs related to visual, auditory, or tactile senses, and can include at least one of a display 151, a sound output interface 152, a haptic module 153, or an optical output interface 154. The display 151 can form a mutual layered structure with a touch sensor or be formed integrally to be implemented as a touch screen. The touch screen simultaneously can serve as a user input interface 123 which provides an input interface between the mobile terminal 100 and the user and provides an output interface between the mobile terminal 100 and the user.

The interface 160 serves as a passage between various types of external devices which are connected to the mobile terminal 100. The interface 160 can include at least one of a wired/wireless headset port, an external charger port, a wired/wireless data port, a memory card port, a port which connects a device equipped with an identification module, an audio input/output (I/O) port, a video input/output (I/O) port, or an earphone port. The mobile terminal 100 can perform appropriate control related to the connected external device in accordance with the connection of the external device to the interface 160.

Further, the memory 170 can store data which supports various functions of the mobile terminal 100. The memory 170 can store a plurality of application programs (or applications) driven in the mobile terminal, data and commands for operations of the mobile terminal 100. At least some of the application programs can be downloaded via an external server through wireless communication. Further, at least some of the application programs for basic functions of the mobile terminal 100 (for example, functions for receiving and making calls and receiving and sending messages) can be provided in the mobile terminal 100 from the time of shipment. The application programs are stored in the memory 170, and installed in the mobile terminal 100 to be driven by the controller 180 to perform an operation (or functions) of the mobile terminal 100.

In addition to the operations related to the application programs, the controller 180 can generally control overall operation of the mobile terminal 100. The controller 180 can process a signal, data, or information which is input or output through the above-described components, or drive the application programs stored in the memory 170 to provide or process appropriate information or functions to the user.

Further, in order to drive the application program stored in the memory 170, the controller 180 can control at least some of components described with reference to FIG. 1. Moreover, the controller 180 can combine and operate at least two of components included in the mobile terminal 100 to drive the application program.

The power supply 190 receives application of external power or internal power, and supplies the power to the respective components included in the mobile terminal 100 under the control of the controller 180. The power supply 190 includes a battery 191 which can be a built-in battery or a replaceable battery.

At least some of the above-described components can operate in cooperation with each other to implement the operation, the control, or the control method of the mobile terminal according to various embodiments which will be described below. Further, the operation, the control, or the control method of the mobile terminal can be implemented on the mobile terminal by driving at least one application program stored in the memory 170.

Hereinafter, prior to describing various embodiments implemented by the mobile terminal 100 described above, the above-mentioned components will be described in more detail with reference to FIG. 1. First, the wireless transceiver 110 will be described. The broadcast receiving module 111 of the wireless transceiver 110 receives a broadcast signal and/or broadcast-related information from an external broadcast management server through a broadcast channel. The broadcast channel can include a satellite channel and a ground wave channel. Two or more broadcast receiving modules for simultaneous broadcast reception or broadcast channel switching for at least two broadcast channels can be provided to the mobile terminal 100.

The broadcast management sever can refer to a server which generates and transmits a broadcast signal and/or broadcast-related information or a server which is supplied with the previously generated broadcast signal and/or broadcast-related information and transmits the broadcast signal and/or the broadcast-related information to the terminal. The broadcast signal includes not only a TV broadcast signal, a radio broadcast signal, and a data broadcast signal, but also a broadcast signal obtained by combining the TV broadcast signal or the radio broadcast signal with the data broadcast signal.

The broadcast signal can be encoded according to at least one of technical standards for transmitting and receiving a digital broadcast signal (or broadcast schemes, for example, ISO, IEC, DVB, or ATSC), and the broadcast receiving module 111 can receive the digital broadcast signal using an appropriate method for the technical specification determined by the technical standards. The broadcast-related information can refer to information related to a broadcast channel, a broadcast program, or a broadcast service provider. The broadcast-related information can also be provided through the mobile communication network. In this instance, the broadcast-related information can be received by the mobile communication module 112.

The broadcast-related information can exist in various types such as an electronic program guide of digital multimedia broadcast (DMB) or an electronic service guide of a digital video broadcast-handheld (DVB-H). The broadcast signal and/or the broadcast-related information received by the broadcast receiving module 111 can be stored in the memory 170.

The mobile transceiver 112 can transmit/receive a wireless signal to/from at least one of a base station, an external terminal, or a server on a mobile communication network established according to the technical standards or communication methods for mobile communication (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)).

The wireless signal can include a voice call signal, a video call signal, or various types of data in accordance with transmission or reception of a text/multimedia message. The wireless internet module 113 refers to a module for wireless internet connection and can be embodied in the mobile terminal 100 or installed at the outside of the mobile terminal 100. The wireless Internet module 113 can be configured to transmit/receive a wireless signal in a communication network according to wireless internet technologies.

The wireless internet technique includes wireless LAN (WLAN), wireless fidelity (Wi-Fi), Wi-Fi direct, digital living network alliance (DLNA), wireless broadband (Wi-Bro), world interoperability for microwave access (WiMAX), high speed downlink packet access (HSDPA), high speed uplink packet access (HSUPA), long term evolution (LTE), and long term evolution-advanced (LTE-A). The wireless internet module 113 can transmit or receive data in accordance with at least one wireless internet technique within a range including internet techniques which have not been described above.

From the viewpoint that the wireless internet connection by WiBro, HSDPA, HSUPA, GSM, CDMA, WCDMA, LTE, LTE-A, etc. is performed by the mobile communication network, the wireless internet module 113 which performs the wireless internet connection through the mobile communication network can be understood as a type of the mobile communication module 112.

The near field communication module 114 is provided for short range communication and supports the near field communication using at least one of Bluetooth™ radio frequency identification (RFID), infrared data association (IrDA), ultra wideband (UWB), ZigBee, Near Field Communication (NFC), wireless fidelity (Wi-Fi), Wi-Fi Direct, or Wireless Universal Serial Bus (Wireless USB). The near field communication module 114 can support wireless communication between the mobile terminal 100 and the wireless communication system, between the mobile terminal 100 and the other mobile terminal 100, or between the mobile terminal 100 and a network in which the other mobile terminal 100 (or external server) is located, through the near field wireless communication network. The near field wireless communication network can be a near field wireless personal communication network.

Here, the other mobile terminal 100 can be a wearable device (for example, a smart watch, a smart glass, or a head mounted display (HMD)) which is capable of exchanging data (or interworking) with the mobile terminal 100 according to the present disclosure. The near field communication module 114 can detect (or recognize) a wearable device which is capable of communication with the mobile terminal 100, in the vicinity of the mobile terminal 100. Moreover, when the detected wearable device is authenticated to communicate with the mobile terminal 100 according to the present disclosure, the controller 180 can transmit at least a part of data processed in the mobile terminal 100 to the wearable device through the near field communication module 114. Therefore, the user of the wearable device can use the data processed in the mobile terminal 100 through the wearable device. For example, according to this, when a phone call is received by the mobile terminal 100, the user can make a phone call through the wearable device, or when a message is received by the mobile terminal 100, the user can check the received message through the wearable device.

The GNSS sensor 115 is a module for obtaining the position (or the current position) of a mobile terminal, and its representative examples include a global positioning system (GPS) module or a Wi-Fi module. For example, when a GPS module is utilized, the mobile terminal can obtain the position of the mobile terminal using a signal transmitted from the GPS satellite. As another example, when a Wi-Fi module is utilized, the mobile terminal can obtain the position of the mobile terminal based on information of a wireless access point (AP) which transmits and receives wireless signals with the Wi-Fi module. If necessary, the position information module 115 can perform any function of another module of the wireless transceiver 110 to substitutably or additionally obtain data on the position of the mobile terminal. As a module used to obtain a position (or a current position) of the display device for a vehicle, the position information module 115 is not limited to a module which directly calculates or obtains the position of the mobile terminal.

Next, the input interface 120 is provided to input video information (or signals), audio information (or signals), data, or an information input from the user, and in order to input the video information, the mobile terminal 100 can include one or a plurality of cameras 121. The camera 121 processes an image frame such as a still image or a moving image obtained by an image sensor in a video call mode or a photographing mode. The processed image frame can be displayed on the display 151 or stored in the memory 170. Further, the plurality of cameras 121 equipped in the mobile terminal 100 can be disposed to form a matrix structure, and a plurality of pieces of image information having various angles or focal points can be input to the mobile terminal 100 through the cameras 121 that form the matrix structure. Further, the plurality of cameras 121 can be disposed to have a stereo structure to obtain a left image and a right image to implement a stereoscopic image.

The microphone 122 processes an external sound signal as electrical speech data. The processed voice data can be utilized in various forms in accordance with a function which is being performed by the mobile terminal 100 (or an application program which is being executed). In the microphone 122, various noise removal algorithms which remove noise generated during the process of receiving the external sound signal can be implemented.

The user input interface 123 receives information from the user, and when the information is input through the user input interface 123, the controller 180 can control the operation of the mobile terminal 100 so as to correspond to the input information. The user input interface 123 can include a mechanical input interface (or a mechanical key, for example, a button located on a front, rear, or side surface of the mobile terminal 100, a dome switch, a jog wheel, a jog switch, etc.) and a touch type input interface. For example, the touch type input interface can be formed by a virtual key, a soft key, or a visual key which is disposed on the touchscreen through a software process or a touch key which is disposed on a portion other than the touchscreen. The virtual key or the visual key can be displayed on the touch screen in various shapes, and for example, can be formed by graphics, text, icons, video, or a combination thereof.

The sensor 140 senses at least one of information in the mobile terminal, surrounding environment information around the mobile terminal, or user information and generates a sensing signal corresponding to the information. the controller 180 can control the driving or the operation of the mobile terminal 100 or perform data processing, functions, or operations related to the application program installed in the mobile terminal 100, based on the sensing signal. Representative sensors among various sensors which can be included in the sensor 140 will be described in more detail below.

First, the proximity sensor 141 is a sensor which senses the presence of an object approaching a predetermined sensing surface or nearby objects, using an electromagnetic field force or infrared ray without any mechanical contact. The proximity sensor 141 can be disposed in an internal area of the mobile terminal which is enclosed by the above-described touch screen or in the vicinity of the touch screen.

Examples of the proximity sensor 141 can include a transmission type photoelectric sensor, a direct reflection type photoelectric sensor, a mirror reflection type photoelectric sensor, a high frequency oscillation type proximity sensor, a capacitive proximity sensor, a magnetic proximity sensor, and an infrared proximity sensor. When the touch screen is a capacitive type, the proximity sensor 141 can be configured to detect the proximity of the object with a change in the electric field in accordance with the proximity of the object having conductivity. In this instance, the touch screen (or the touch sensor) itself can be classified as a proximity sensor.

For convenience of description, when an object approaches the touch screen without contacting the touch screen, and it is recognized that the object is located above the touch screen, it is referred to as a "proximity touch". When the object actually touches the touch screen, it is referred to as a "contact touch". A position at which the object proximately touches the touch screen refers to a position at which the object vertically corresponds to the touch screen when the object proximately touches the touch screen. The proximity sensor 141 can sense a proximate touch and a proximate touch pattern (for example, a proximate touch distance, a proximate touch direction, a proximate touch speed, a proximate touch time, a proximate touch position, a proximate touch movement state, etc.). As described above, the controller 180 can process data (or information) corresponding to the proximate touch operation and the proximate touch pattern sensed by the proximity sensor 141, and can further output visual information corresponding to the processed data on the touch screen. Furthermore, the controller 180 can control the mobile terminal 100 to process different operations or data (or information) depending on whether the touch on the same point on the touch screen is a proximity touch or a contact touch.

The touch sensor senses a touch (or a touch input) applied to the touch screen (or the display 151) using at least one of various touch types such as a resistive film type, a capacitive type, an infrared type, an ultrasonic type, or a magnetic field type. For example, the touch sensor can be configured to convert a change of a pressure which is applied to a specific portion of the touch screen, or a capacitance which is generated in a specific portion, into an electrical input signal. The touch sensor can be configured to detect a position and an area where a touch subject which applies a touch onto the touch screen is touched on the touch sensor, and a capacitance at the time of the touch. Here, the touch subject is an object which applies a touch to the touch sensor, and can include, for example, a finger, a touch pen, a stylus pen, a pointer, etc.

As described above, when there is a touch input to the touch sensor, corresponding signals are transmitted to a touch controller. The touch controller processes the signal(s) and then transmits corresponding data to the controller 180. By doing this, the controller 180 can confirm which area of the display 151 is touched. Here, the touch controller can be a separate component from the controller 180, or can be the controller 180 itself.

the controller 180 can perform different control or the same control depending on a type of a touch subject which touches the touch screen (or a touch key equipped other than the touch screen). Whether to perform the different control or the same control depending on the type of touch subject can be determined in accordance with an operating state of the current mobile terminal 100 or an application program which is being executed.

A touch sensor and a proximity sensor described above can, independently or in combination, sense various types of touches on the touch screen, such as a short (or tap) touch, a long touch, a multi touch, a drag touch, a flick touch, a pinch-in touch, a pinch-out touch, a swipe touch, or a hovering touch.

The ultrasonic sensor can recognize position information of a sensing object using an ultrasonic wave. the controller 180 can calculate a position of a wave generating source by information sensed by the optical sensor and the plurality of ultrasonic sensors. A position of the wave generating source can be calculated using the property that light is much faster than an ultrasonic wave, that is, the time in which light reaches the optical sensor is much faster than the time in which the ultrasonic wave reaches the ultrasonic sensor. More specifically, the position of the wave generating source can be calculated using a time difference of the time of arrival of the ultrasonic wave with respect to light which serves as a reference signal.

As seen from the configuration of the input interface 120, the camera 121 includes at least one of a camera sensor (for example, a CCD or a CMOS), a photo sensor (or an image sensor), or a laser sensor. The camera 121 and the laser sensor can be combined to sense a touch of a sensing object for a three-dimensional stereoscopic image. The photo sensor, which is laminated on a display element, is configured to scan a motion of a sensing object proximate to the touch screen. More specifically, the photo sensor is formed by mounting photo diodes and transistors (TR) in rows/columns to scan contents which are disposed on the photo sensor using an electrical signal that changes in accordance with an amount of light applied to the photo diode. That is, the photo sensor calculates coordinates of a sensing object in accordance with a changed amount of light, and position information of the sensing object can be obtained through the coordinates.

The display 151 displays (outputs) information processed in the mobile terminal 100. For example, the display 151 can display execution screen information of an application program driven in the mobile terminal 100 and user interface (UI) and graphic user interface (GUI) information in accordance with the execution screen information.

Further, the display 151 can be configured as a stereoscopic display which displays a stereoscopic image. A three-dimensional display type such as a stereoscopic type (a glass type), an autostereoscopic type (a glass-free type), a projection type (a holographic type) can be applied to the stereoscopic display.

The speaker 152 can output audio data received from the wireless transceiver 110 or stored in the memory 170 in a call signal reception mode, a phone-call mode, a recording mode, a speech recognition mode, or a broadcast reception mode. The sound output interface 152 can also output a sound signal related to a function (for example, a call signal reception sound or a message reception sound) performed in the mobile terminal 100. Such a sound output interface 152 can include, for example, a receiver, a speaker, and a buzzer.

The haptic module 153 can generate various tactile effects that can be felt by the user. A representative example of the tactile effect generated by the haptic actuator 153 can be vibration. An intensity and a pattern of the vibration generated in the haptic module 153 can be controlled by the selection of the user or a setting of the controller 180. For example, the haptic module 153 can compose different vibrations and output the composed vibrations, or sequentially output the different vibrations.

In addition to vibration, the haptic module 153 generates various tactile effects such as effects by a pin arrangement which vertically moves to a contact skin surface, an injection force or a suction force of air through an injection port or a suction port, grazing on a skin surface, electrode contact, or stimulation of an electrostatic force or effects of reproducing a cold or hot sensation using a heat absorbing or heat emitting element.

The haptic module 153 can not only transmit a tactile effect by means of direct contact, but can also be implemented to allow the user to feel a tactile effect by muscular sensation of a finger or an arm. Two or more haptic modules 153 can be provided in accordance with a configuration aspect of the mobile terminal 100.

The optical output interface 154 outputs a signal for notifying occurrence of an event using light of a light source of the mobile terminal 100. Examples of events generated in the mobile terminal 100 can be message reception, call signal reception, missed call, alarm, schedule notification, email reception, and information reception through an application.

The signal output from the optical output interface 154 is implemented as the mobile terminal emits single color or multicolor light to a front surface or a rear surface. When the mobile terminal senses the event confirmation of the user, the signal output can be completed.

The interface 160 serves as a passage between all external devices which are connected to the mobile terminal 100. The interface 160 receives data from the external device or is supplied with a power source and transmits the data to each component in the mobile terminal 100, or transmits the data in the mobile terminal 100 to the external device. For example, the interface 160 can include a wired/wireless headset port, an external charger port, a wired/wireless data port, a memory card port, a port which connects a device equipped with an identification module, an audio input/output (I/O) port, a video input/output (I/O) port, an earphone port, etc.

The identification module is a chip in which various information for authenticating a usage right of the mobile terminal 100 is stored, and can include, for example, a user identity module (UIM), a subscriber identification module (SIM), and a universal subscriber identity module (USIM). A device with an identification module (hereinafter, "identification device") can be manufactured as a smart card. Therefore, the identification device can be connected to the mobile terminal 100 through the I/O connector 160.

When the mobile terminal 100 is connected to an external cradle, the interface 160 can serve as a passage through which the power is supplied from the cradle to the mobile terminal 100 or a passage through which various command signals are transmitted to the mobile terminal 100. Various command signals or the power input from the cradle can operate a signal for recognizing that the mobile terminal 100 is precisely mounted in the cradle.

The memory 170 can store a program for an operation of the controller 180, or temporarily store input/output data (for example, a phone book, a message, a still image, a moving image, etc.). The memory 170 can store data on a vibration or a sound of various patterns output when the touch is input onto the touch screen.

The memory 170 can include at least one type of storage medium of a flash memory type, a hard disk type, a solid state disk (SSD) type, a silicon disk drive (SDD) type, a multimedia card micro type, and card type memories (for example, SD or XD memory and the like), a random access memory (RAM), a static random access memory (SRAM), a read only memory (ROM), an electrically erasable programmable read only memory (EEPROM), a programmable read only memory (PROM), a magnetic memory, a magnetic disk, and an optical disk. The mobile terminal 100 can operate in association with a web storage which performs a storage function of the memory 170 on the Internet.

As described above, the controller 180 can control an operation related to the application program and the overall operation of the mobile terminal 100. For example, when the state of the mobile terminal satisfies a predetermined condition, the controller 180 can execute or release a locking state which restricts an input of a control command of a user for the applications.

Further, the controller 180 can perform control and processing related to voice call, data communication, and video call, or perform a pattern recognition process which recognizes a handwriting input or a picture drawing input performed on the touch screen as a text or an image, respectively. Moreover, the controller 180 can control any one or a combination of a plurality of components described above to implement various embodiments which will be described below on the mobile terminal 100 according to the present disclosure.

The power supply 190 receives application of an external power or an internal power by the control of the controller 180, and supplies the power required for operations of components. The power supply 190 includes a battery 191, and the battery can be a chargeable embedded battery and be detachably coupled to the terminal body to be charged.

Further, the power supply 190 includes a connection port, and the connection port can be configured as one example of an interface 160 to which an external charger which supplies a power to charge a battery is electrically connected.

As another example, the power supply 190 can be configured to wirelessly charge the battery without using the connection port. In this instance, the power supply 190 can receive the power using one or more of an inductive coupling method based on a self-induction phenomenon or a magnetic resonance coupling method based on an electromagnetic resonance phenomenon. Various embodiments below can be implemented in a recording medium readable by a computer or a similar device using hardware, software, or a combination thereof.

The display 151 displays (outputs) information processed in the mobile terminal 100. For example, the display 151 can display execution screen information of an application program driven in the mobile terminal 100 and user interface (UI) and graphic user interface (GUI) information in accordance with the execution screen information.

The display 151 can include at least one of a liquid crystal display (LCD), a thin film transistor liquid crystal display (TFT LCD), an organic light emitting diode (OLED), a flexible display, a three-dimensional display (3D display), or an electronic ink display (e-ink display). Further, two or more displays 151 can be provided in accordance with an implementation type of the mobile terminal 100. In this instance, a plurality of displays can be disposed to be spaced apart from each other or integrally disposed on one surface of the mobile terminal 100 or can be disposed on different surfaces.

The display 151 can include a touch sensor which senses a touch on the display 151 so as to receive the control command by the touch method. Therefore, when the touch is made on the display 151, the touch sensor senses the touch, and based on the touch the controller 180 generates a control command corresponding to the touch. Contents input by the touch method can be letters or numbers, instructions in various modes, menu items which can be designated, or the like.

The microphone 122 is configured to receive a voice of the user, or other sounds. The microphone 122 is equipped in a plurality of locations to receive stereo sounds. The interface 160 serves as a passage through which the mobile terminal 100 is connected to external devices. For example, the interface 160 can be at least one of a connection terminal for connection with other devices (for example, an earphone or an external speaker), a port for near field communication (for example, an infrared port (IrDA port), a Bluetooth port, and a wireless LAN port,), or a power supply terminal for supplying power to the mobile terminal 100. The interface 160 can be implemented as a socket type which accommodates an external card such as a subscriber identification module (SIM), a user identity module (UIM), and a memory card for information storage.

At least one antenna for wireless communication can be provided in a terminal body. The antenna can be embedded in the terminal body or formed in a case. For example, the antenna which forms a part of the broadcast receiving module 111 (see FIG. 1) can be configured to be drawn from the terminal body. Alternatively, the antenna can be formed to be a film type to be attached onto an inner surface of a housing, or a case including a conductive material can serve as an antenna.

The terminal body includes the power supply 190 (see FIG. 1) which supplies the power to the mobile terminal 100. The power supply 190 can be embedded in the terminal body or include a battery 191 which is configured to be detachable at the outside of the terminal body.

The battery 191 can be configured to be supplied with power through a power cable connected to the interface 160. Further, the battery 191 can be configured to be wirelessly chargeable by a wireless charging device. The wireless charging can be implemented by a self-induction method or a resonance method (magnetic resonance method).

An accessory which protects the exterior or supports or extends the function of the mobile terminal 100 can be added to the mobile terminal 100. An example of the accessory can include a cover or a pouch which covers at least one surface of the mobile terminal 100 or accommodates the mobile terminal 100. The cover or the pouch can interwork with the display 151 to extend the function of the mobile terminal 100. Another example of the accessory can include a touch pen which supports or extends a touch input on the touch screen.

Hereinafter, in the description of the embodiments of the present disclosure, an X-direction, a Y-direction, and a Z-direction shown in the drawings are orthogonal to each other.

Figure 2A:
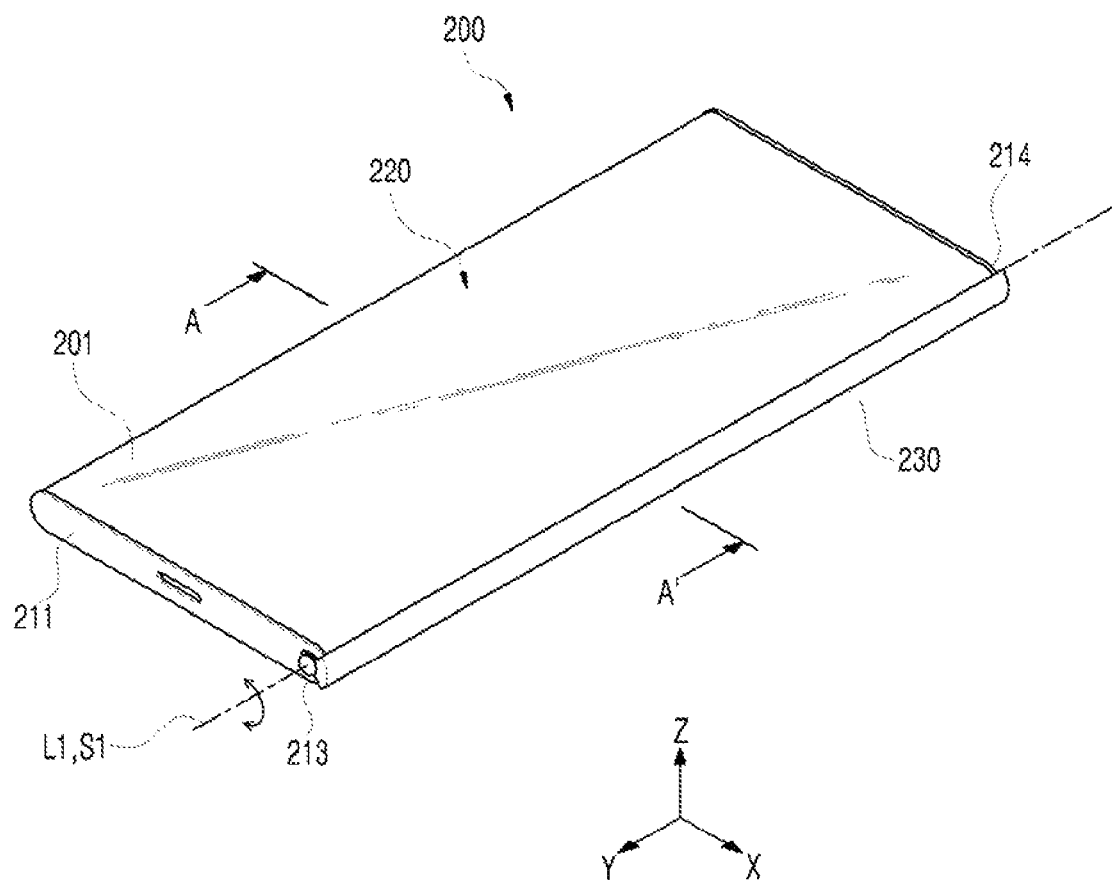
FIG. 2A is a perspective view illustrating a flexible display device according to another embodiment of the present disclosure.
Figure 2B:
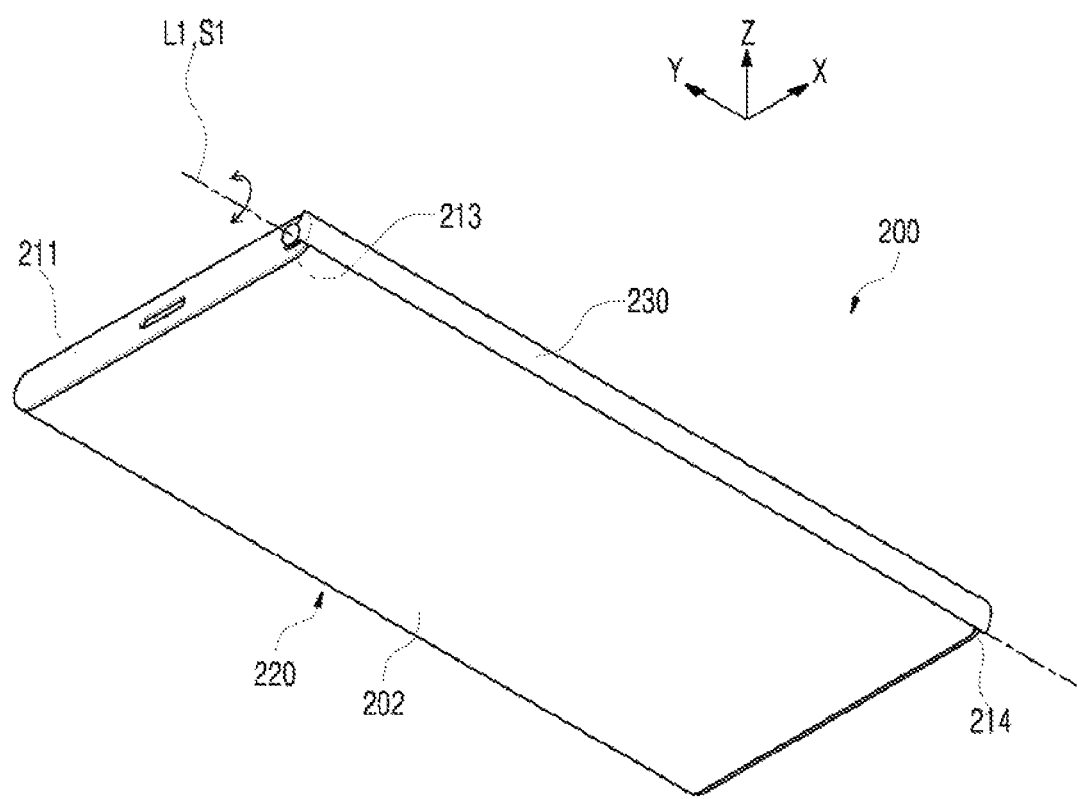
FIG. 2B is a bottom perspective view illustrating the flexible display device shown in FIG. 2A.
Figure 3A:
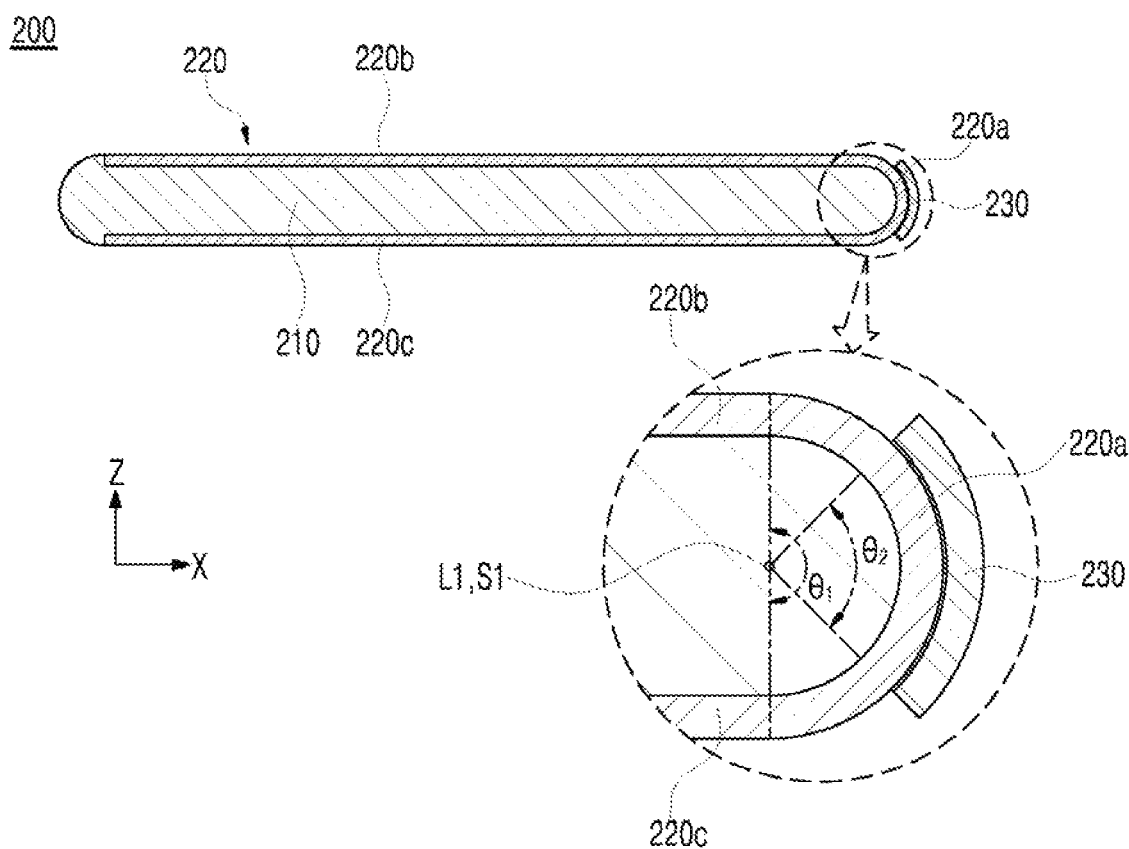
FIG. 3A is a cross-sectional view taken along line A-A' in FIG. 2A, which schematically illustrates the flexible display device according to an embodiment of the present disclosure.
Figure 3B:
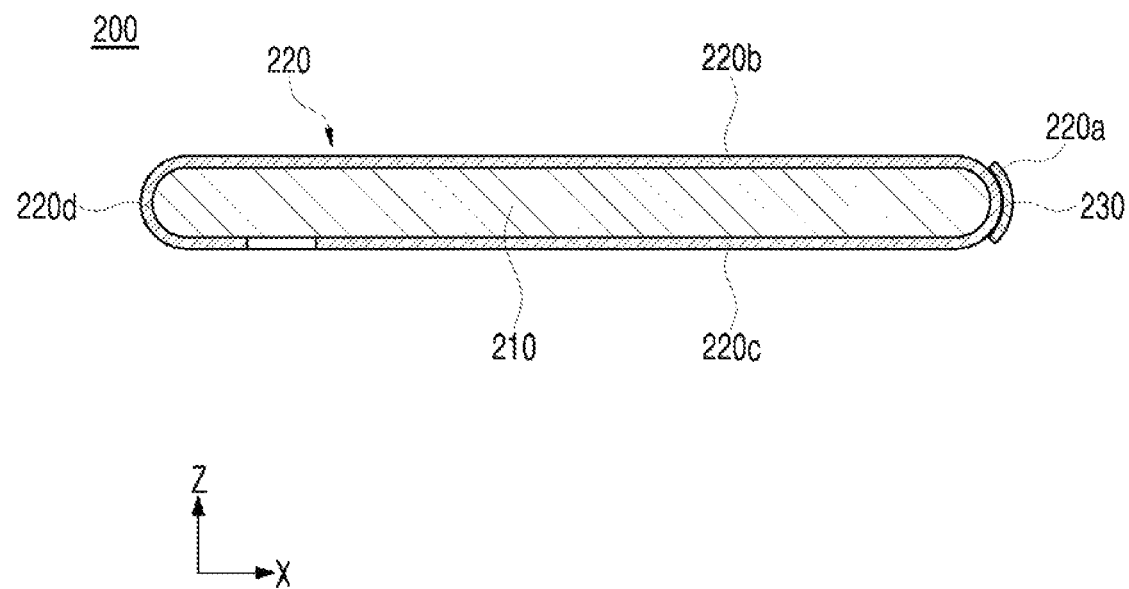
FIG. 3B is a cross-sectional view schematically illustrating a flexible display device according to still another embodiment of the present disclosure.
Figure 3C:
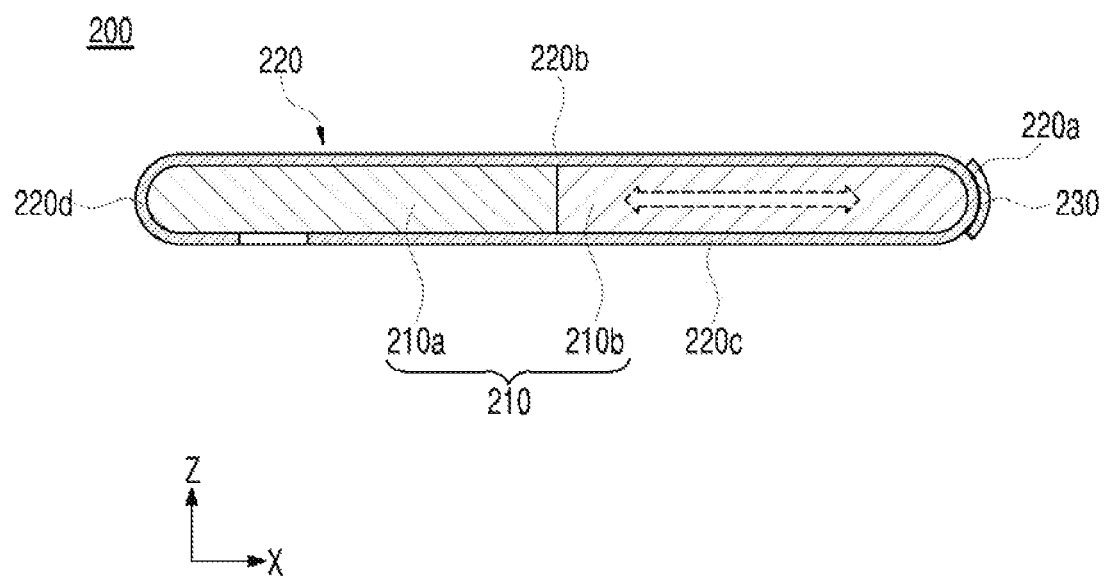
FIG. 3C is a cross-sectional view schematically illustrating a flexible display device according to still another embodiment of the present disclosure.
Figure 3D:
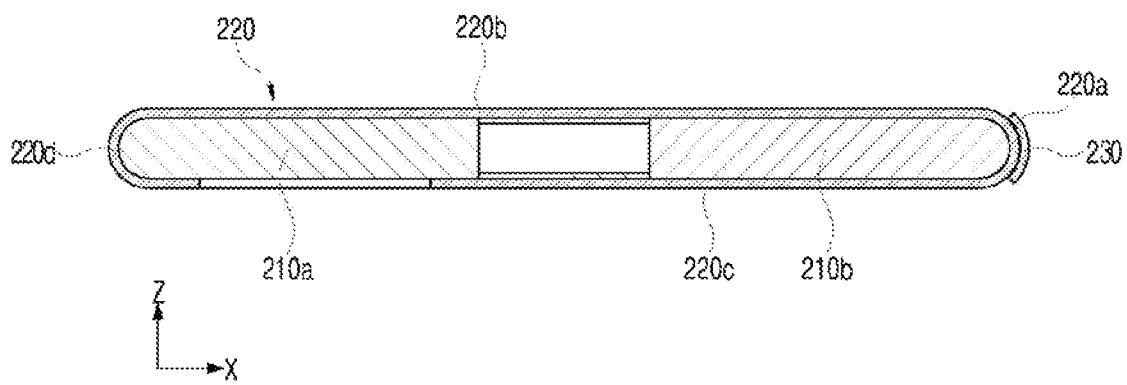
FIG. 3D is a view illustrating the state in which the shape of the flexible display device shown in FIG. 3C is varied.
Figure 4A:
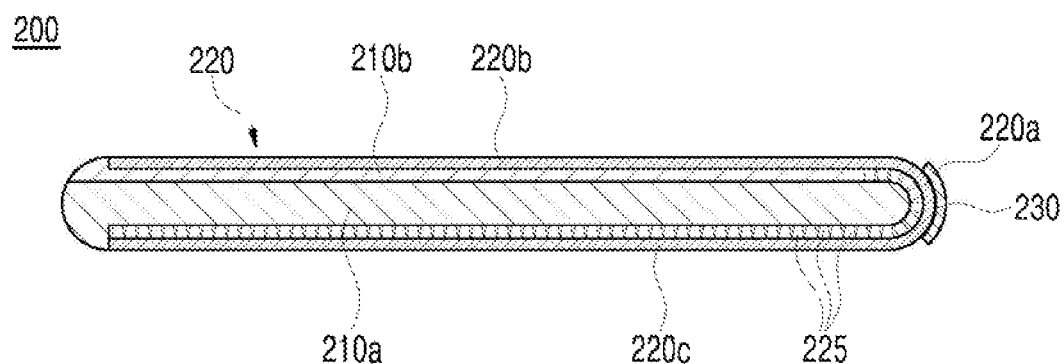
FIG. 4A is a cross-sectional view schematically illustrating a flexible display device according to still another embodiment of the present disclosure.
Figure 4B:
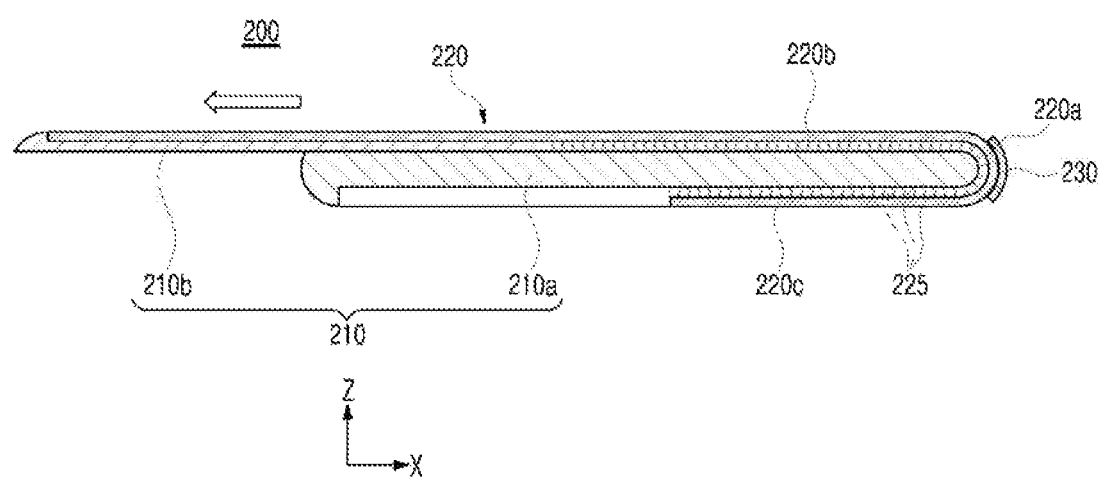
FIG. 4B is a view illustrating the state in which the shape of the flexible display device shown in FIG. 4A is varied.
Figure 5A:
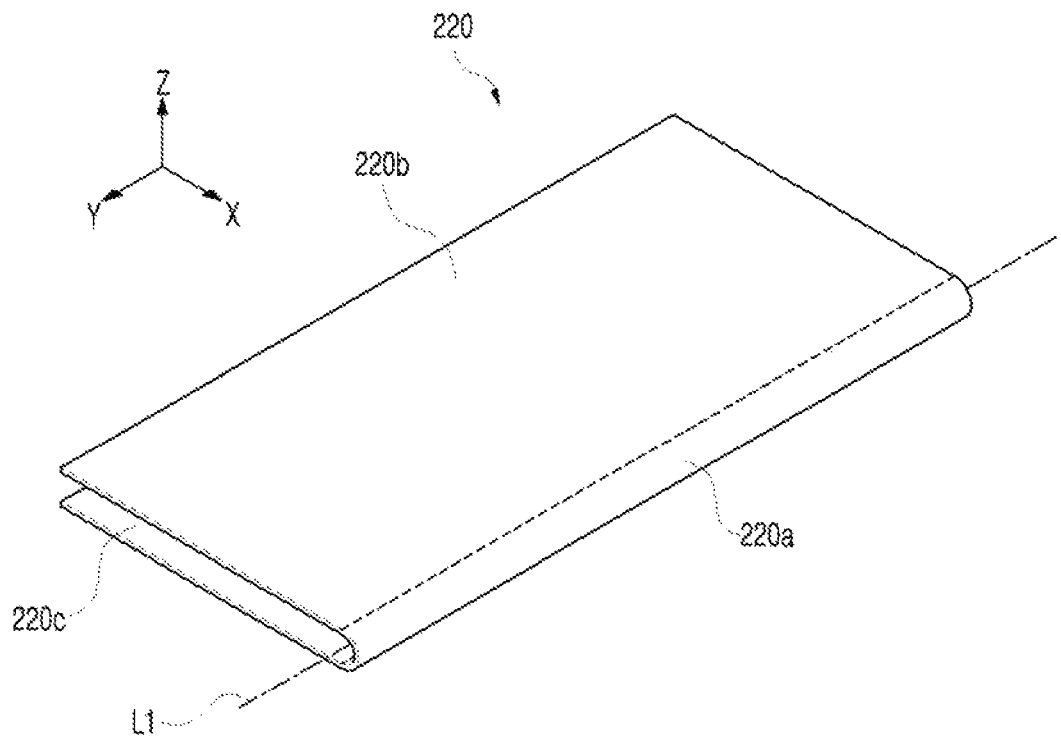
FIG. 5A is a perspective view illustrating a flexible display according to an embodiment of the present disclosure.
Figure 5B:
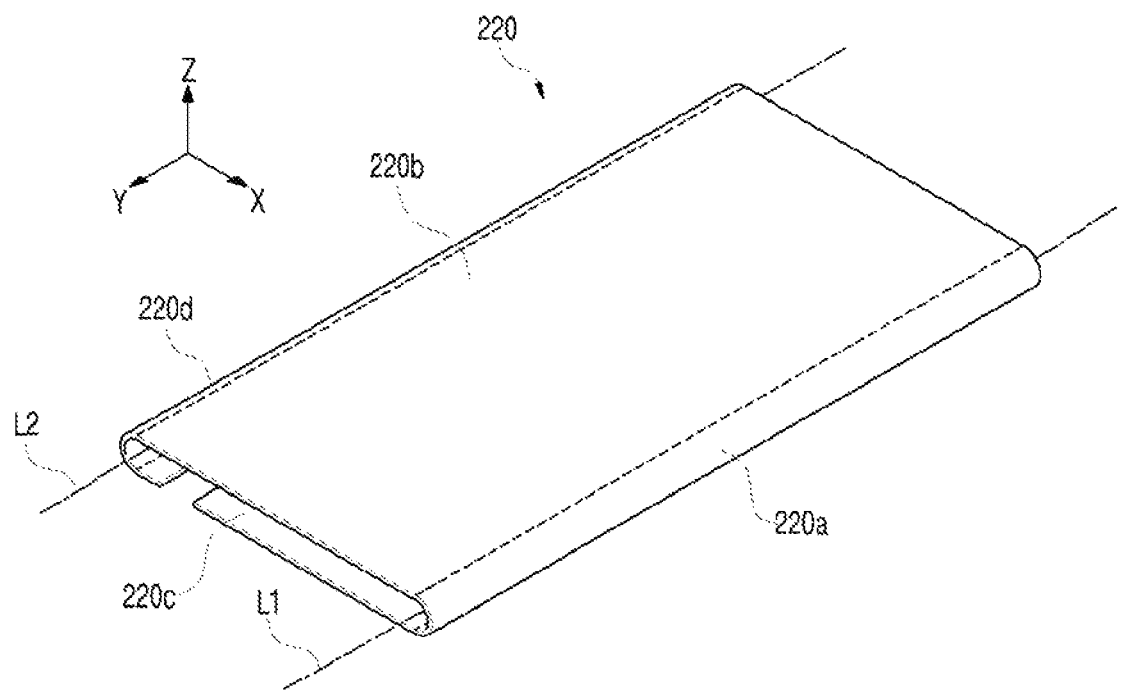
FIG. 5B is a perspective view illustrating a flexible display according to another embodiment of the present disclosure.

FIGS. 2A and 2B are perspective views illustrating a flexible display device 200 according to an embodiment of the present disclosure. In addition, FIGS. 3A to 4B are cross-sectional views schematically illustrating a flexible display device 200 according to still another embodiment of the present disclosure. In particular, FIG. 3D is a view illustrating the state in which the shape of the flexible display device 200 shown in FIG. 3C is varied, and FIG. 4B is a view illustrating the state in which the shape of the flexible display device 200 shown in FIG. 4A is varied. Further, FIG. 5A is a perspective view illustrating a flexible display 220 according to other embodiments of the present disclosure.

As shown, the flexible display device 200 can includes a body 210, a flexible display 220, and a first protective guard 230. The flexible display device 200 can includes two surfaces 201 and 202 that are opposite each other. In particular, the flexible display device 200 can include a first surface 201 and a second surface 202, and the direction in which the first surface 201 is oriented (the Z-direction) and the direction in which the second surface 202 is oriented (the direction opposite the Z-direction) can be opposite each other. Hereinafter, the first surface 201 is referred to as a front surface of the flexible display device 200, and the second surface 202 is referred to as a rear surface of the flexible display device 200.

The body 210 defines the overall shape of the flexible display device 200 can and forms a frame of the flexible display device 200. The body 210 can be made of a relatively hard material, and can include plastic, metal, or a combination thereof. Other components that constitute the flexible display device 200 cancan also be coupled to the body 210.

Further, the body 210 can be formed in any of various shapes that are capable of supporting other components coupled thereto. Also, the body 210 can be formed in a flat shape overall, or can be formed in a curved shape having a curved surface. The body 210 can also be formed so as to have an entirely solid interior, or can be formed so as to have a partially hollow interior.

In one example, when viewed from the front (the Z-direction), the body 210 can be formed in a rectangular shape overall, and can also be formed in a flat shape overall. Further, the body 210 can be formed in a unitary invariable shape.

Also, the body 210 can be divided into two or more parts. For example, the body 210 can include a first body 210a and a second body 210b, in which the first body 210a and the second body 210b are formed so as to be movable relative to each other (see FIGS. 3C, 3D, 4A, and 4B). For example, the second body 210b can be formed so as to perform sliding motion (reciprocating motion) relative to the first body 210a. Accordingly, the total area occupied by the body 210 can be varied.

The flexible display 220 is formed in the type of a thin film that is bendable. In addition, the flexible display 220 includes an outer surface and an inner surface, and is coupled to the body 210. The inner surface of the flexible display 220 is a surface that is coupled to the body 210, and the outer surface of the flexible display 220 is a surface that is opposite the inner surface thereof.

Further, at least a portion of the flexible display 220 is exposed to the outside of the body 210 and can include a first curved surface portion 220a and a first surface portion 220b. The first curved surface portion 220a forms an outer surface that is curved about a first curvature center line L1. The first curvature center line L1 is an imaginary straight line that forms the center of curvature of the first curved surface portion 220a.

In addition, the first surface portion 220b forms an outer surface that is parallel to the first curvature center line L1. As shown, the first surface portion 220b can have a uniform cross-section in the longitudinal direction of the first curvature center line L1 can and be a surface that extends from the first curved surface portion 220a.

Further, the first surface portion 220b can form a curved surface overall. In this instance, the curvature of the first surface portion 220b can be smaller than the curvature of the first curved surface portion 220a, and the radius of curvature of the first surface portion 220b can be larger than the radius of curvature of the first curved surface portion 220a. The radius of curvature of the first surface portion 220b can also be much larger than the radius of curvature of the first curved surface portion 220a. For example, when the radius of curvature of the first curved surface portion 220a is "a", the radius of curvature of the first surface portion 220b can be "10*a" or greater.

Also, the first surface portion 220b can form a flat surface overall. For example, the first surface portion 220b can form an outer surface that is a flat surface extending from the first curved surface portion 220a, and can be disposed on the front surface of the body 210.

Hereinafter, the flexible display device 200 according to the embodiment of the present disclosure, in which the first surface portion 220b forms a flat surface, will be described. The direction in which the first surface portion 220b is oriented (the direction in which the outer surface of the first surface portion 220b is oriented, or the Z-direction) can be a first direction. The first surface portion 220b can form the entirety or a portion of the first surface 201 of the flexible display device 200.

In more detail, an image cancan be displayed on each of the first curved surface portion 220a and the first surface portion 220b. As shown, the area of the first surface portion 220b cancan be larger than the area of the first curved surface portion 220a.

Further, flexible display 220 can include a second surface portion 220c that forms an outer surface, which is the surface opposite the first surface portion 220b. In addition, as described later, the flexible display 220 can include a second curved surface portion 220d. An image cancan also be displayed on each of the second surface portion 220c and the second curved surface portion 220d.

When the direction in which the second surface portion 220c is oriented (the direction in which the outer surface of the second surface portion 220c is oriented) is a second direction, the second direction is the direction opposite the first direction (the Z-direction). That is, in the flexible display device 200 according to the embodiment of the present disclosure, the first surface cancan be oriented in the forward direction, and the second surface cancan be oriented in the backward direction.

In addition, the second surface portion 220c can form the entirety or a portion of the second surface 202 of the flexible display device 200. Also, the second surface portion 220c forms an outer surface that is parallel to the first curvature center line L1. The second surface portion 220c can have a uniform cross-section in the longitudinal direction of the first curvature center line L1. The second surface portion 220c can be a surface that extends from the first curved surface portion 220a.

Further, the flexible display 220 cancan be configured such that the first surface portion 220b, the first curved surface portion 220a, and the second surface portion 220c are sequentially connected to each other. The first surface portion 220b, the first curved surface portion 220a, and the second surface portion 220c cancan also be formed in a U shape overall.

Further, the second surface portion 220c cancan form a curved surface overall. In this instance, the curvature of the second surface portion 220c can be smaller than the curvature of the first curved surface portion 220a, and the radius of curvature of the second surface portion 220c can be larger than the radius of curvature of the first curved surface portion 220a. The radius of curvature of the second surface portion 220c can be much larger than the radius of curvature of the first curved surface portion 220a. For example, when the radius of curvature of the first curved surface portion 220a is "a", the radius of curvature of the second surface portion 220c can be "10*a" or greater.

Also, the second surface portion 220c cancan form a flat surface overall. Further, the second surface portion 220c cancan be formed parallel to the first surface portion 220b. Hereinafter, the flexible display device 200 according to the embodiment of the present disclosure, in which the second surface portion 220c is formed in the shape of a flat surface and is formed parallel to the first surface portion 220b, will be described.

When the body 210 is formed in a unitary invariable shape, the flexible display 220 cancan also be formed in an invariable shape. In other words, each of the first curved surface portion 220a, the first surface portion 220b, the second surface portion 220c, and/or the second curved surface portion 220d cancan have a constant shape (see FIGS. 3A and 3B).

In contrast, when the body 210 is formed in a variable shape, the flexible display 220 cancan also be formed in a variable shape. For example, when the body 210 includes a first body 210a and a second body 210b and when the second body 210b is formed so as to perform reciprocating motion relative to the first body 210a in the direction parallel to the first surface portion 220b, a portion of the flexible display 220 cancan be moved and the shape thereof cancan be varied in the state of being coupled to the first body 210a or the second body 210b (see FIGS. 3C, 3D, 4A, and 4B).

When the flexible display 220 is formed in a variable shape and when the second body 210b is formed so as to perform reciprocating motion relative to the first body 210a, a plurality of support bars 225 can be coupled to the rear surface of the flexible display 220 (see FIGS. 4A and 4B). Further, each of the support bars 225 extends long in the direction parallel to the first curvature center line L1 (the Y-direction), and has a uniform cross-section in the direction parallel to the first curvature center line L1. Each of the support bars 225 can can also have the same thickness (the length in the Z-direction) as the second body 210b, and support the flexible display 220, the shape of which is variable.

When the state in which the first body 210a and the second body 210b are coupled to each other so as to occupy the smallest area is referred to as a first state (the state shown in FIG. 3C or FIG. 4A) and the state in which the second body 210b slides away from the first body 210a such that the overall area of the body 210 increases is referred to as a second state (the state shown in FIG. 3D or FIG. 4B), if the second body 210b performs reciprocating motion relative to the first body 210a between the first state and the second state, the area of the first surface portion 220b cancan increase or decrease.

When the second body 210b performs reciprocating motion relative to the first body 210a between the first state and the second state, the portion that forms the first curved surface portion 220a cancan be changed to the first surface portion 220b. Alternatively, the portion that forms the first curved surface portion 220a can can be changed to the second surface portion 220c.

When the second body 210b moves relative to the first body 210a so as to switch from the first state to the second state, the portion that forms the first curved surface portion 220a in the first state can be changed to the first surface portion 220b in the second state, and the portion that forms the second surface portion 220c in the first state can be changed to the first curved surface portion 220a in the second state.

When the second body 210b moves relative to the first body 210a so as to switch from the second state to the first state, the portion that forms the first curved surface portion 220a in the second state can be changed to the second surface portion 220c in the first state, and the portion that forms the first surface portion 220b in the second state can be changed to the first curved surface portion 220a in the first state.

Figure 6A:
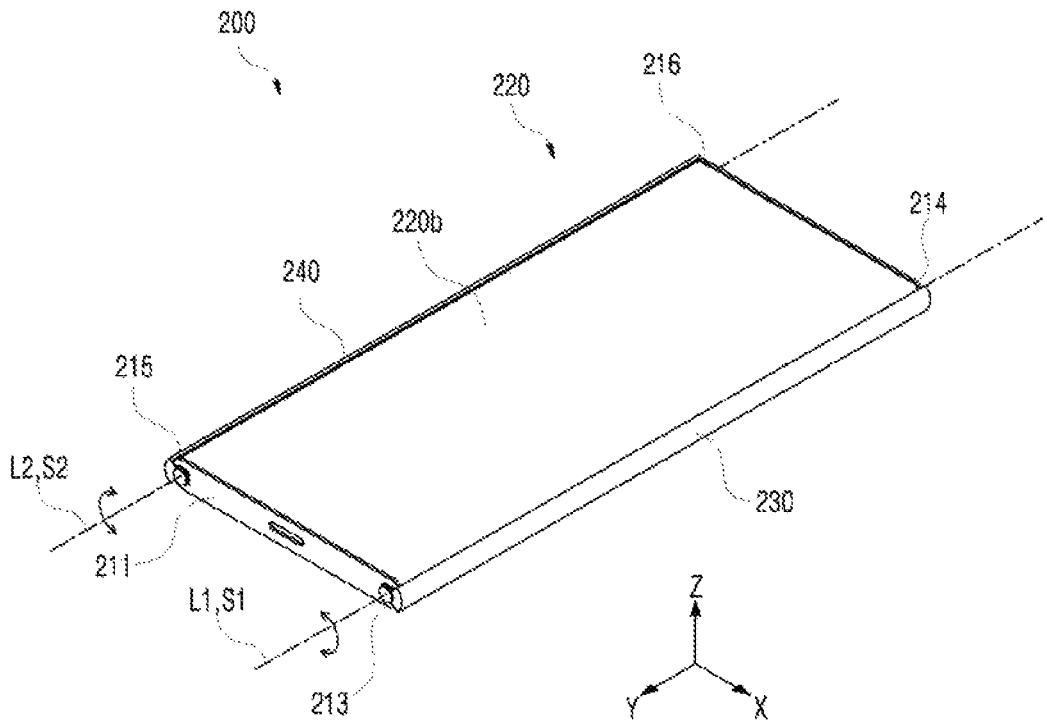
FIG. 6A is a perspective view illustrating a flexible display device according to still another embodiment of the present disclosure.
Figure 6B:
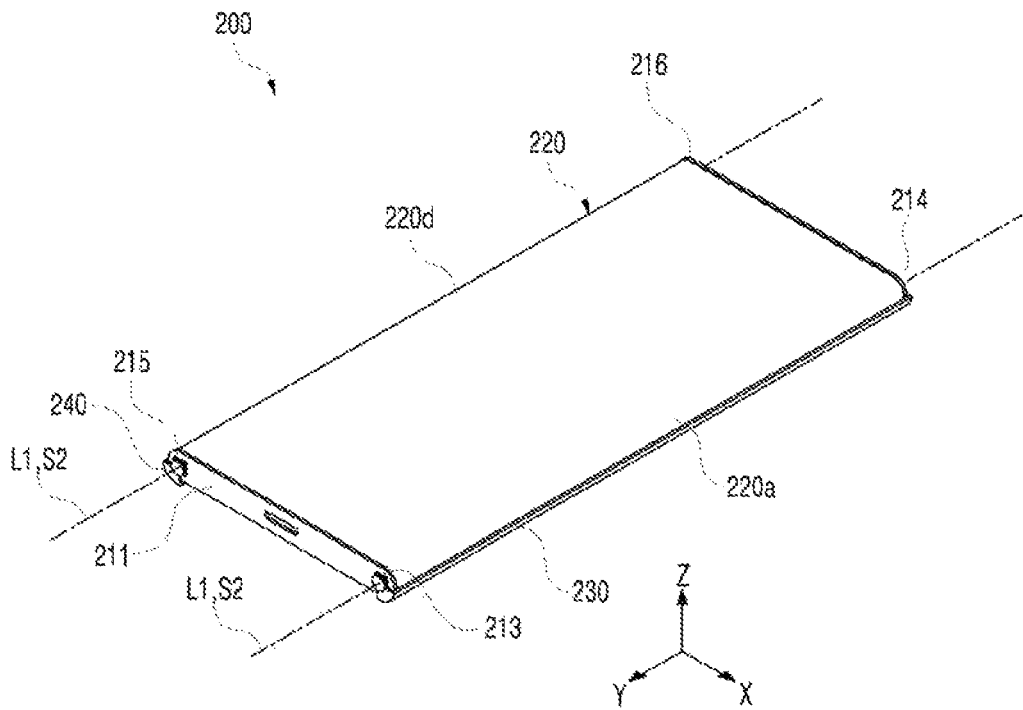
FIG. 6B is a perspective view illustrating the state in which the shape of the flexible display device shown in FIG. 6A is varied.
Figure 7:
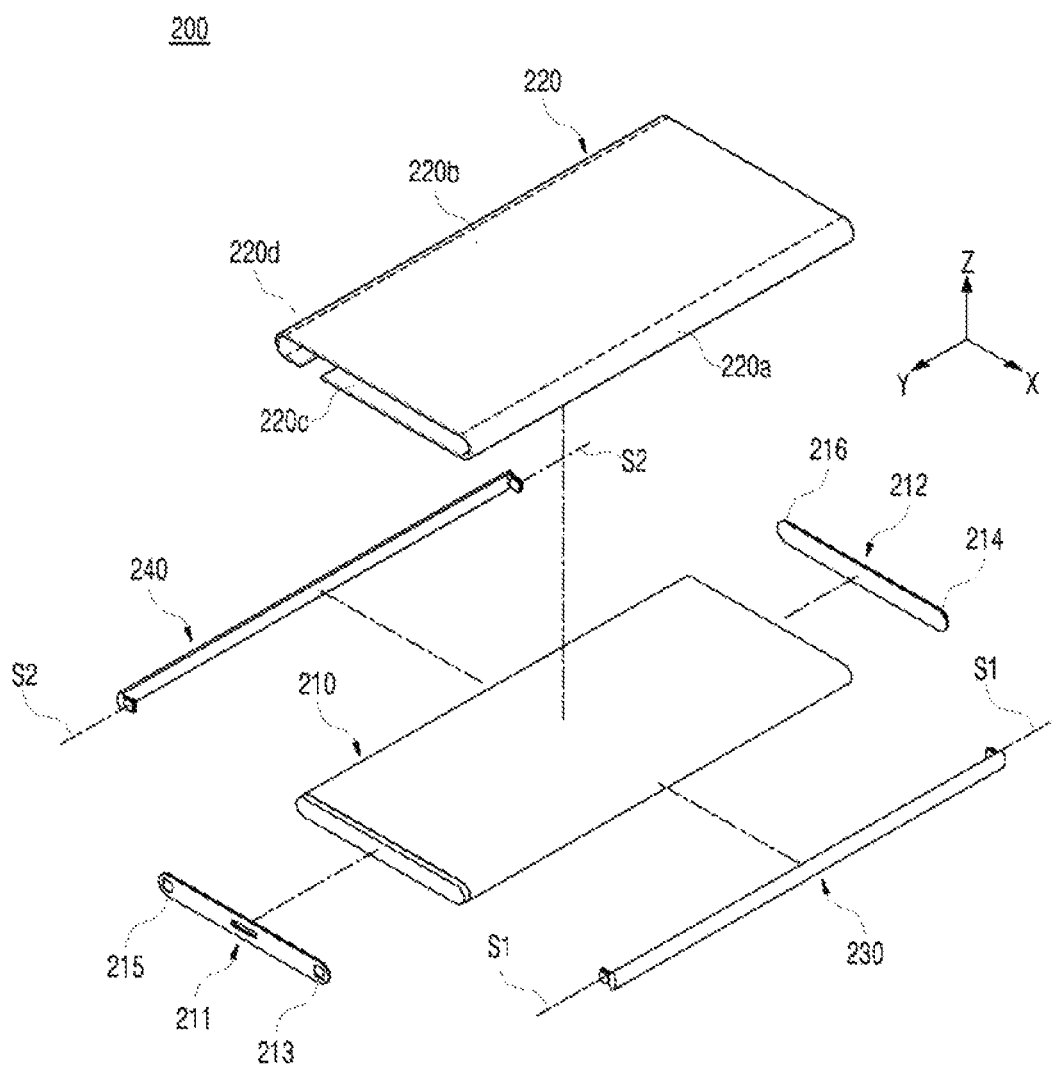
FIG. 7 is an exploded perspective view illustrating the flexible display device shown in FIG. 6A.
Figure 8:
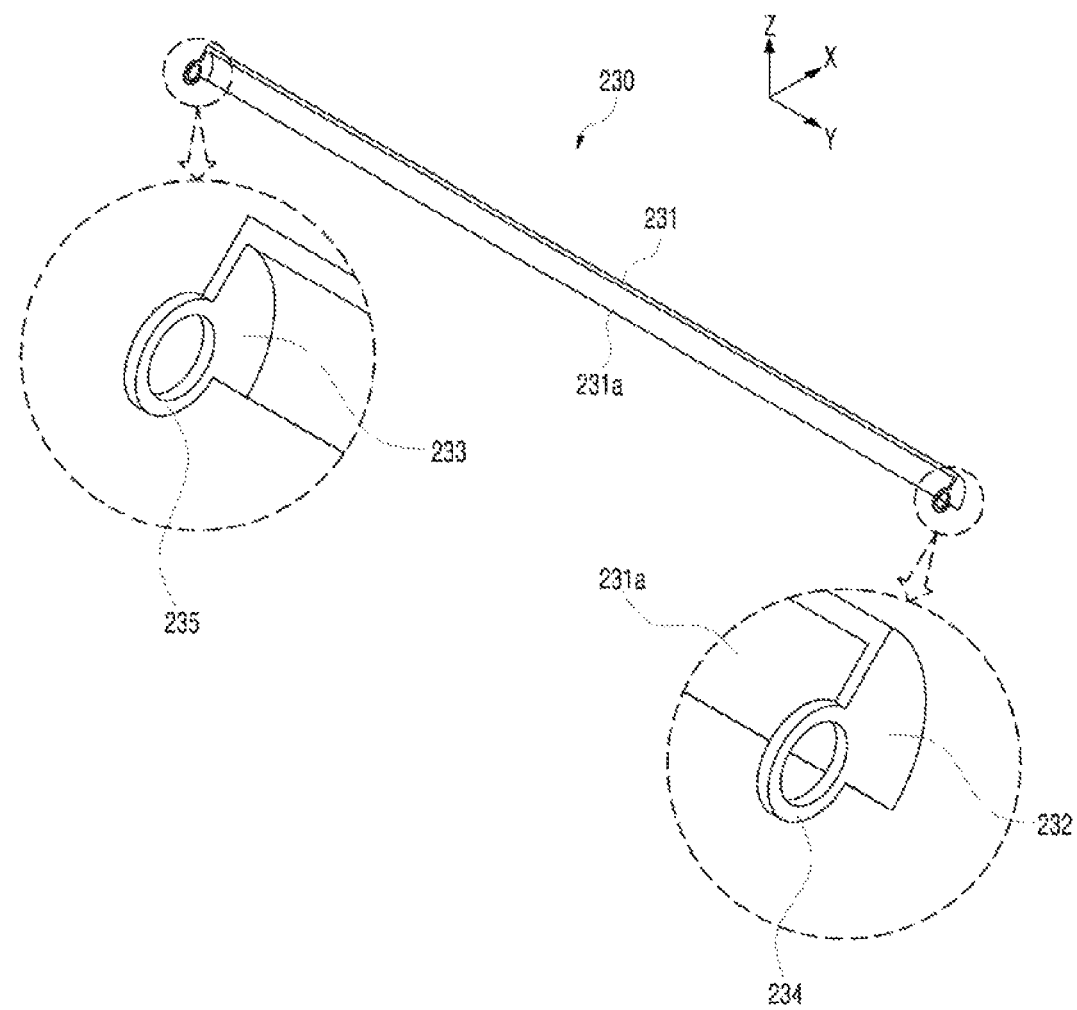
FIG. 8 is a perspective view illustrating a first protective guard shown in FIG. 6A.
Figure 9:
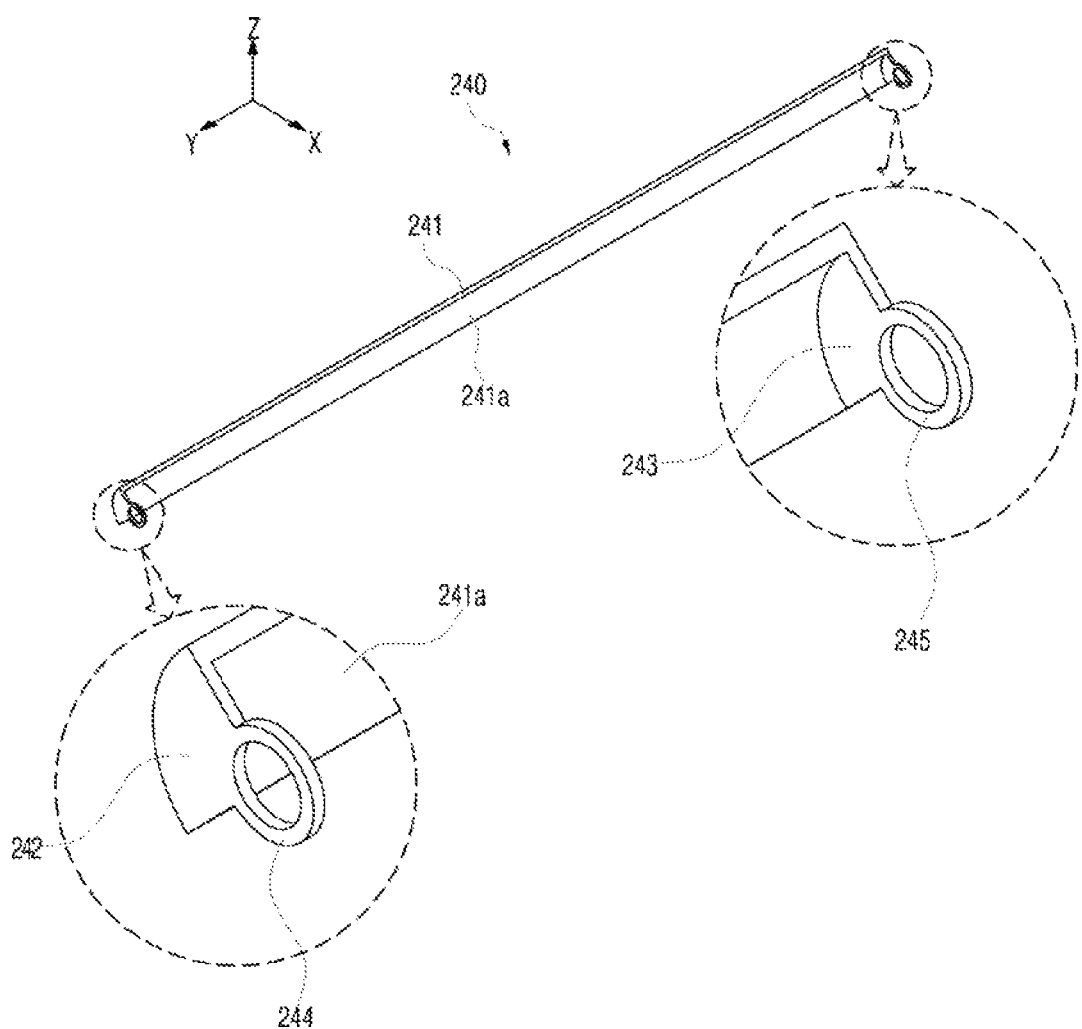
FIG. 9 is a perspective view illustrating a second protective guard shown in FIG. 6A.

Next, FIG. 6A is a perspective view illustrating a flexible display device 200 according to still another embodiment of the present disclosure, FIG. 6B is a perspective view illustrating the state in which the shape of the flexible display device 200 shown in FIG. 6A is varied, FIG. 7 is an exploded perspective view illustrating the flexible display device 200 shown in FIG. 6A, FIG. 8 is a perspective view illustrating a first protective guard 230 shown in FIG. 6A, and FIG. 9 is a perspective view illustrating a second protective guard 240 shown in FIG. 6A.

Figure 10A:
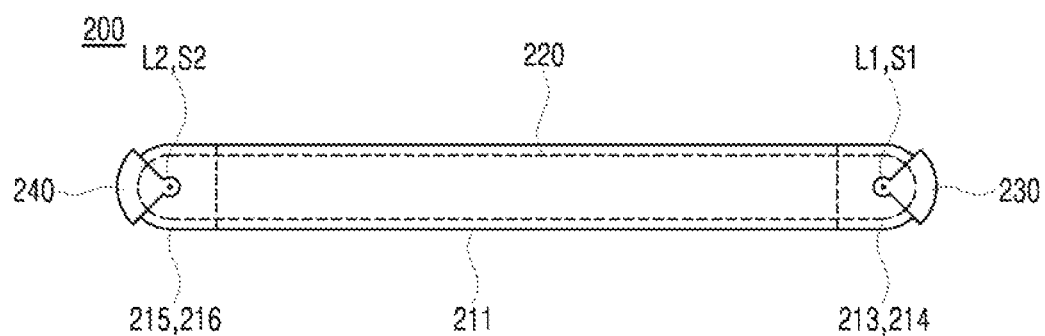
FIG. 10A is a side view illustrating a flexible display device according to still another embodiment of the present disclosure.
Figure 10A:
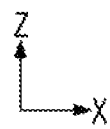
Figure 10B:
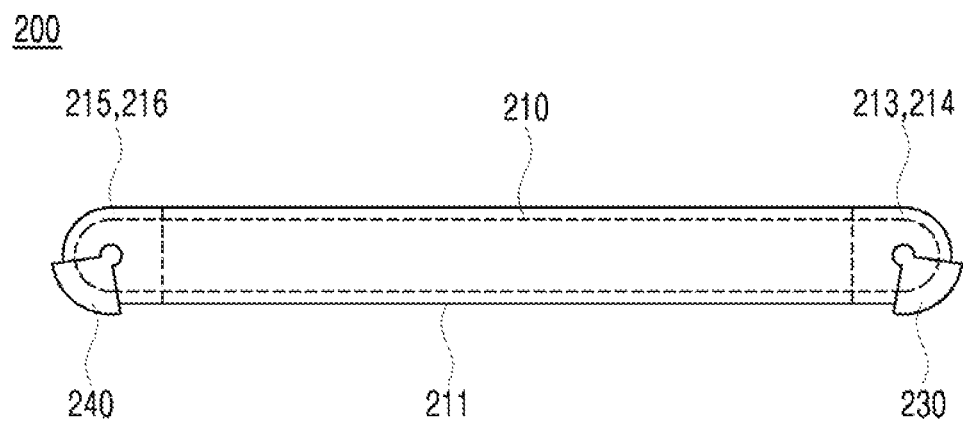
FIG. 10B is a side view illustrating the state in which the shape of the flexible display device shown in FIG. 10A is varied.
Figure 10B:
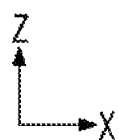
Figure 11A:
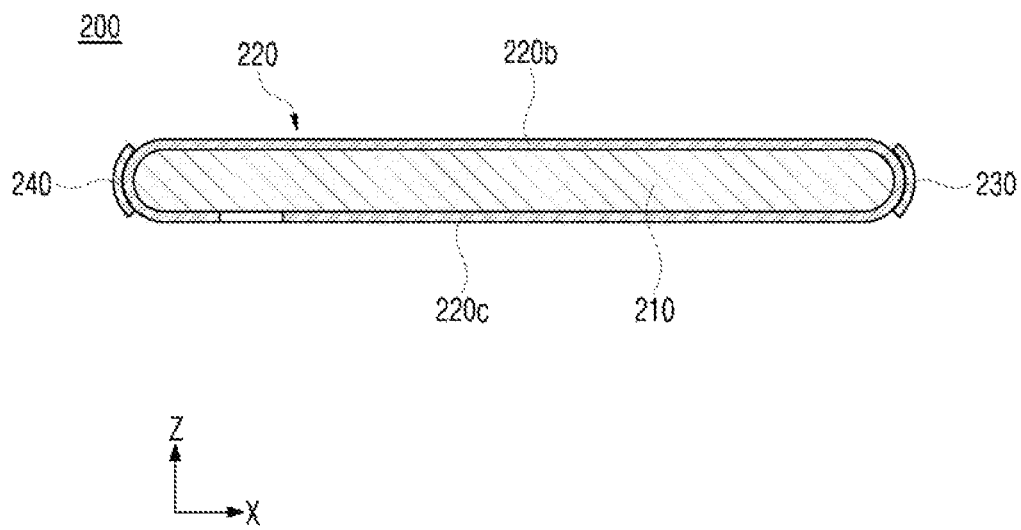
FIG. 11A is a cross-sectional view illustrating a flexible display device according to still another embodiment of the present disclosure.
Figure 11B:
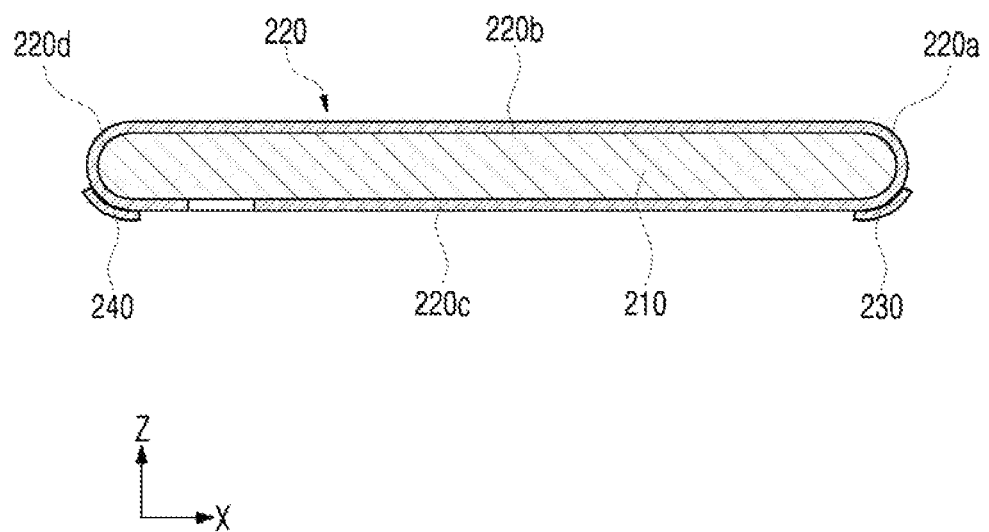
FIG. 11B is a cross-sectional view illustrating the state in which the shape of the flexible display device shown in FIG. 11A is varied.

FIG. 10A is a side view illustrating the flexible display device 200 according to still another embodiment of the present disclosure, and FIG. 10B is a side view illustrating the state in which the shape of the flexible display device 200 shown in FIG. 10A is varied. FIG. 11A is a cross-sectional view illustrating the flexible display device 200 according to still another embodiment of the present disclosure, and FIG. 11B is a cross-sectional view illustrating the state in which the shape of the flexible display device 200 shown in FIG. 11A is varied.

Figure 12:
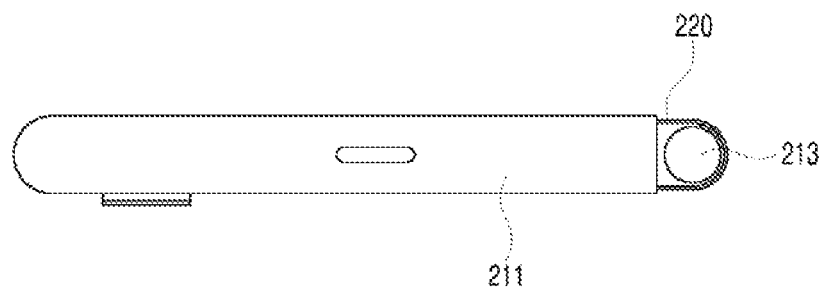
FIG. 12 is a side view illustrating a flexible display device according to still another embodiment of the present disclosure, in which illustration of the first protective guard is omitted.
Figure 13A:
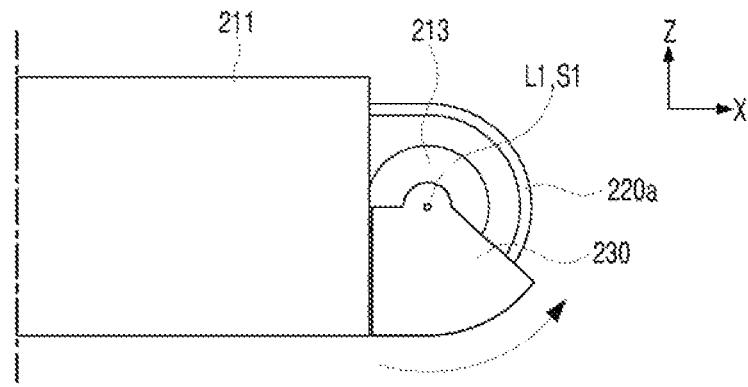
FIG. 13A is a side view illustrating a portion of a flexible display device according to still another embodiment of the present disclosure.
Figure 13B:
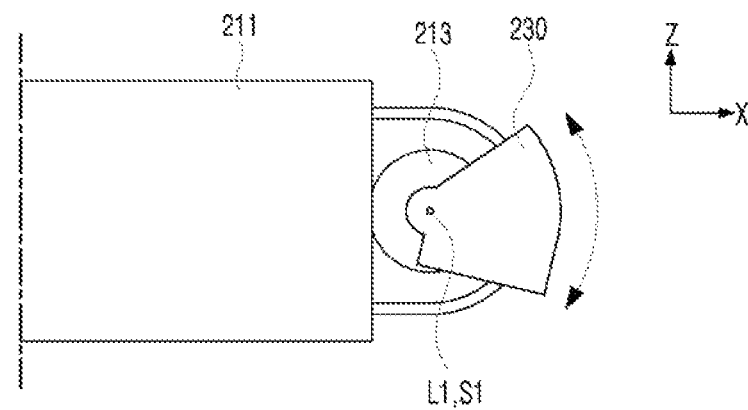
FIG. 13B is a side view illustrating the state in which the shape of the flexible display device shown in FIG. 13A is varied.
Figure 14A:
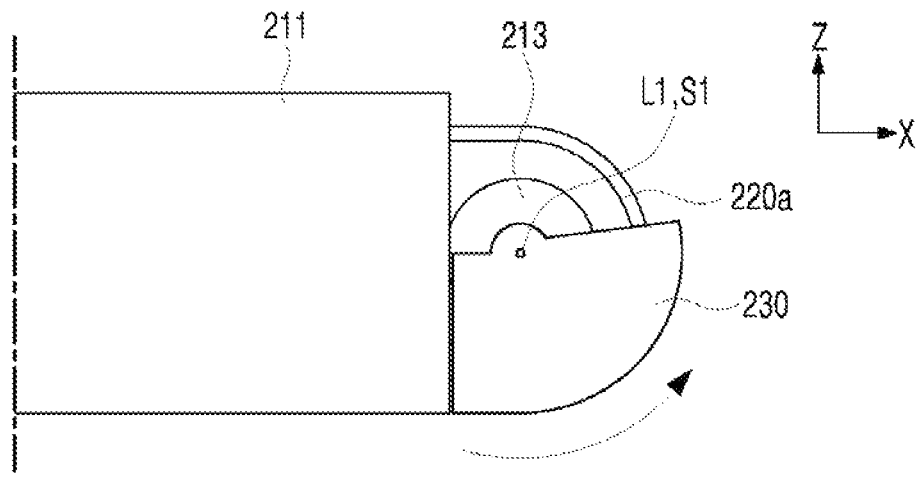
FIG. 14A is a side view illustrating a portion of a flexible display device according to still another embodiment of the present disclosure.
Figure 14B:
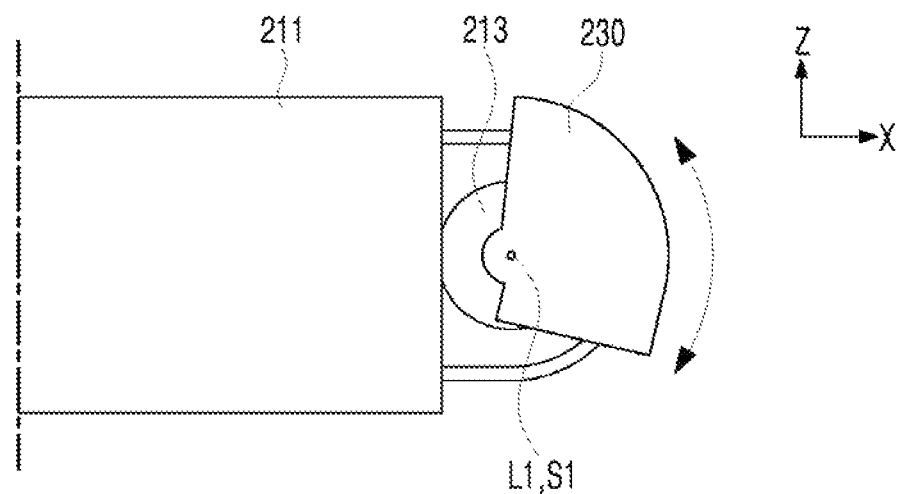
FIG. 14B is a side view illustrating the state in which the shape of the flexible display device shown in FIG. 14A is varied.

Further, FIG. 12 is a side view illustrating the flexible display device 200 according to still another embodiment of the present disclosure. In FIG. 12, illustration of the first protective guard 230 is omitted. Also, FIG. 13A is a side view illustrating a portion of the flexible display device 200 according to still another embodiment of the present disclosure, and FIG. 13B is a side view illustrating the state in which the shape of the flexible display device 200 shown in FIG. 13A is varied. In addition, FIG. 14A is a side view illustrating a portion of the flexible display device 200 according to still another embodiment of the present disclosure, and FIG. 14B is a side view illustrating the state in which the shape of the flexible display device 200 shown in FIG. 14A is varied.

The flexible display device 200 may include a first plate 211 and a second plate 212 forming a portion of the body 210. The first plate 211 and the second plate 212 can be provided separately from each other, and can be respectively disposed at positions further outward than the two opposite edges of the first surface portion 220b in the direction parallel to the first curvature center line L1. The first plate 211 and the second plate 212 can also be disposed to be symmetrical to each other.

In addition, the first plate 211 and the second plate 212 can protrude further outward than the first surface portion 220b and the second surface portion 220c in the directions orthogonal to the surfaces of the first surface portion 220b and the second surface portion 220c (the Z-direction and the direction opposite the Z-direction). That is, the first plate 211 and the second plate 212 can protrude further than the first surface portion 220b in the first direction, and can protrude further than the second surface portion 220c in the second direction.

The flexible display device 200 may also include a first support portion 213 and a second support portion 214. The first support portion 213 and the second support portion 214 can form a portion of the body 210.

When the body 210 is formed in a unitary shape, the first support portion 213 can form a portion of the first plate 211, and the second support portion 214 can form a portion of the second plate 212. When the body 210 includes the first body 210a and the second body 210b, which are moveable relative to each other, the first plate 211 and the second plate 212 can form a portion of the first body 210a, and the first support portion 213 and the second support portion 214 can form a portion of the second body 210b.

The first support portion 213 and the second support portion 214 are provided separately from each other, and are respectively disposed on the two opposite sides of the first curved surface portion 220a in the direction parallel to the first curvature center line L1. The first support portion 213 and the second support portion 214 can form the two opposite end portions of the flexible display device 200 according to the embodiment of the present disclosure. The first support portion 213 and the second support portion 214 can form the two opposite end portions of the flexible display device 200 that are the closest to the first curved surface portion 220a.

In addition, the first support portion 213 and the second support portion 214 can be disposed at positions further outward than the two opposite edges of the first curved surface portion 220a so as to be symmetrical to each other. The first protective guard 230 can also include a first protective plate 231, a first connection plate 232, and a second connection plate 233 (FIG. 8).

In particular, the first protective plate 231 is formed in the direction parallel to the first curvature center line L1, and is located at the outer side of the flexible display 220. The first protective plate 231 can be formed to have a predetermined area, and can be configured to shield a portion of the outer surface of the flexible display 220. The first protective plate 231 can be formed to have a uniform cross-section along the first curvature center line L1. Also, the first protective plate 231 can extend along the first curvature center line L1. That is, the longitudinal direction of the first protective plate 231 can be parallel to the first curvature center line L1.

In addition, the first protective plate 231 can be formed in a curved shape and have an inner surface 231a (a surface facing the flexible display 220) formed in a curved shape. Further, the first protective plate 231 connects the first connection plate 232 and the second connection plate 233. The first connection plate 232 and the second connection plate 233 are also portions that are respectively connected to the two opposite end portions of the first protective plate 231.

In addition, the first connection plate 232 can be formed to be bent at one end portion of the first protective plate 231, and the second connection plate 233 can be formed to be bent at the opposite end portion of the first protective plate 231. Each of the first connection plate 232 and the second connection plate 233 can be formed in the shape of a plate that forms a surface orthogonal to the first curvature center line L1. Also, the inner surface of each of the first connection plate 232 and the second connection plate 233 can form a surface orthogonal to the first curvature center line L1.

Each of the first connection plate 232 and the second connection plate 233 can be formed in a fan shape and be formed symmetrical with each other. In addition, the first protective guard 230 can be coupled to the body 210 so as to perform motion (reciprocating motion) relative to the body 210.

Also, the first protective guard 230 can be coupled to the body 210 so as to perform rotation (reciprocating rotation) relative to the body 210. When the first support portion 213 and the second support portion 214 are provided, the first protective guard 230 can be coupled to the body 210 so as to perform rotation (reciprocating rotation) relative to the first support portion 213 and the second support portion 214.

In more detail, a first rotation axis S1 is the rotation axis of the first protective guard 230. As shown, the first rotation axis S1 is parallel to the first curvature center line L1. Also, the first rotation axis S1 can lie in the same line as the first curvature center line L1. That is, the first rotation axis S1 can coincide with the first curvature center line L1. Specifically, the first connection plate 232 can be coupled to the body 210 so as to be rotatable about the first rotation axis S1. Further, the first connection plate 232 can be movably coupled to the first support portion 213. The first connection plate 232 can be coupled to the first support portion 213 so as to be rotatable about the first rotation axis S1.

In addition, the second connection plate 233 can be coupled to the body 210 so as to be rotatable about the first rotation axis S1. Further, the second connection plate 233 can be movably coupled to the second support portion 214. The second connection plate 233 can be coupled to the second support portion 214 so as to be rotatable about the first rotation axis S1.

In the flexible display device 200 according to the embodiment of the present disclosure, the first protective guard 230, which is movable (rotatable) relative to the body 210, the first support portion 213, and the second support portion 214, can function as a protective structure for protecting the flexible display 220, and can shield or expose at least a portion of the first curved surface portion 220a.

During the use of the flexible display device 200, when it is desired to display an image through the first surface portion 220b and the first curved surface portion 220a and to expose the first surface portion 220b and the first curved surface portion 220a to a user, the first protective guard 230 can be rotated relative to the body 210 such that the first protective plate 231 of the first protective guard 230 is located on the second surface 202 of the flexible display device 200.

In addition, during the use of the flexible display device 200, when no image is displayed through the first curved surface portion 220a or when it is desired to protect the first curved surface portion 220a, the first protective guard 230 can be rotated relative to the body 210 such that the first protective plate 231 of the first protective guard 230 is located directly on the outer side of the first curved surface portion 220a. In this instance, the first protective plate 231 can shield the entirety or a portion of the first curved surface portion 220a.

As described above, the first support portion 213 and the second support portion 214 can be disposed at positions further outward than the two opposite edges of the first curved surface portion 220a. That is, the flexible display 220 can be located between the first support portion 213 and the second support portion 214. In particular, the first curved surface portion 220a can be located between the first support portion 213 and the second support portion 214.

Each of the first support portion 213 and the second support portion 214 can be formed to have a curved edge. The edge of the first support portion 213 and the edge of the second support portion 214 can be formed in an arc shape about the first curvature center line L1.

The vertical distance from the first curvature center line L1 to the edge of the first support portion 213 can be greater than the radius of curvature of the first curved surface portion 220a, and the vertical distance from the first curvature center line L1 to the edge of the second support portion 214 can be greater than the radius of curvature of the first curved surface portion 220a.

As described above, the first protective plate 231 can have a curved inner surface. In this instance, the inner surface 231a of the first protective plate 231 can be formed to be concentric with the first curved surface portion 220a.

The angle $\theta_1$ that the first curved surface portion 220a forms about the first curvature center line L1 can be 180°, and the angle $\theta_2$ that the first protective plate 231 forms about the first rotation axis S1 can be any angle within the range from 30° to 120° (see FIGS. 3A, 13A, 13B, 14A, and 14B).

Further, the flexible display 220 can include the second curved surface portion 220d forming an outer surface that is curved about a second curvature center line L1, which is parallel to the first curvature center line L1. The second curved surface portion 220d is formed to be convex in the direction opposite the direction in which the first curved surface portion 220a is convex.

In addition, the second curvature center line L1 is an imaginary straight line that forms the center of curvature of the second curved surface portion 220d and can be symmetrical to the first curved surface portion 220a. The flexible display device 200 may also include a third support portion 215, a fourth support portion 216, and a second protective guard 240.

In particular, the third support portion 215 and the fourth support portion 216 are provided separately from each other, and are fixed to the body 210. Also, the third support portion 215 and the fourth support portion 216 are respectively disposed on the two opposite sides of the second curved surface portion 220d in the direction parallel to the second curvature center line L1.

In addition, the third support portion 215 and the fourth support portion 216 can form a portion of the body 210. When the body 210 is formed in a unitary shape, the third support portion 215 can form a portion of the first plate 211, and the fourth support portion 216 can form a portion of the second plate 212.

Further, the third support portion 215 can be formed to be symmetrical to the first support portion 213 described above, and the fourth support portion 216 can be formed to be symmetrical to the second support portion 214 described above. The second protective guard 240 can include a second protective plate 241, a third connection plate 242, and a fourth connection plate 243. The second protective guard 240 can be formed to be symmetrical to the first protective guard 230.

The second protective plate 241 is formed in the direction parallel to the second curvature center line L1, and is located at the outer side of the flexible display 220. The second protective plate 241 can be formed in a curved shape. The second protective plate 241 can have an inner surface 241a (a surface facing the flexible display 220) formed in a curved shape.

Also, the second protective plate 241 connects the third connection plate 242 and the fourth connection plate 243 to each other and can be formed to be symmetrical to the first protective plate 231. The third connection plate 242 can be coupled to the body 210 so as to be rotatable about the second rotation axis S2. The third connection plate 242 can also be coupled to the third support portion 215 so as to be rotatable about the second rotation axis S2 and formed to be bent at one end portion of the second protective plate 241.

In addition, the third connection plate 242 can be formed to be symmetrical to the first connection plate 232. The fourth connection plate 243 can be coupled to the body 210 so as to be rotatable about the second rotation axis S2. The fourth connection plate 243 can be coupled to the fourth support portion 216 so as to be rotatable about the second rotation axis S2. The fourth connection plate 243 can be formed to be bent at the opposite end portion of the second protective plate 241.

Further, the fourth connection plate 243 can be formed to be symmetrical to the second connection plate 233. The second protective guard 240 can be coupled to the body 210 so as to perform rotation (reciprocating rotation) relative to the body 210. When the third support portion 215 and the fourth support portion 216 are provided, the second protective guard 240 can be coupled to the body 210 so as to perform rotation (reciprocating rotation) relative to the third support portion 215 and the fourth support portion 216.

Also, the second rotation axis S2 is the rotation axis of the second protective guard 240. The second rotation axis S2 is parallel to the second curvature center line L1. The second rotation axis S2 can lie in the same line as the second curvature center line L1. That is, the second rotation axis S2 can coincide with the second curvature center line L1. Specifically, the third connection plate 242 can be coupled to the body 210 so as to be rotatable about the second rotation axis S2. Further, the third connection plate 242 can be coupled to the third support portion 215 so as to be rotatable about the second rotation axis S2.

In addition, the fourth connection plate 243 can be coupled to the body 210 so as to be rotatable about the second rotation axis S2. Further, the fourth connection plate 243 can be coupled to the fourth support portion 216 so as to be rotatable about the second rotation axis S2.

In addition, the second protective guard 240, which is rotatable relative to the body 210, the third support portion 215, and the fourth support portion 216, can function as a protective structure for protecting the flexible display 220, and can shield or expose at least a portion of the second curved surface portion 220d.

During the use of the flexible display device 200, when it is desired to display an image through the first surface portion 220b and the second curved surface portion 220d and to expose the first surface portion 220b and the second curved surface portion 220d to a user, the second protective guard 240 can be rotated relative to the body 210 such that the second protective plate 241 of the second protective guard 240 is located on the second surface 202 of the flexible display device 200.

In addition, during the use of the flexible display device 200, when no image is displayed through the second curved surface portion 220d or when it is desired to protect the second curved surface portion 220d, the second protective guard 240 can be rotated relative to the body 210 such that the second protective plate 241 of the second protective guard 240 is located directly on the outer side of the second curved surface portion 220d. In this instance, the second protective plate 241 can shield the entirety or a portion of the second curved surface portion 220d.

Figure 15:
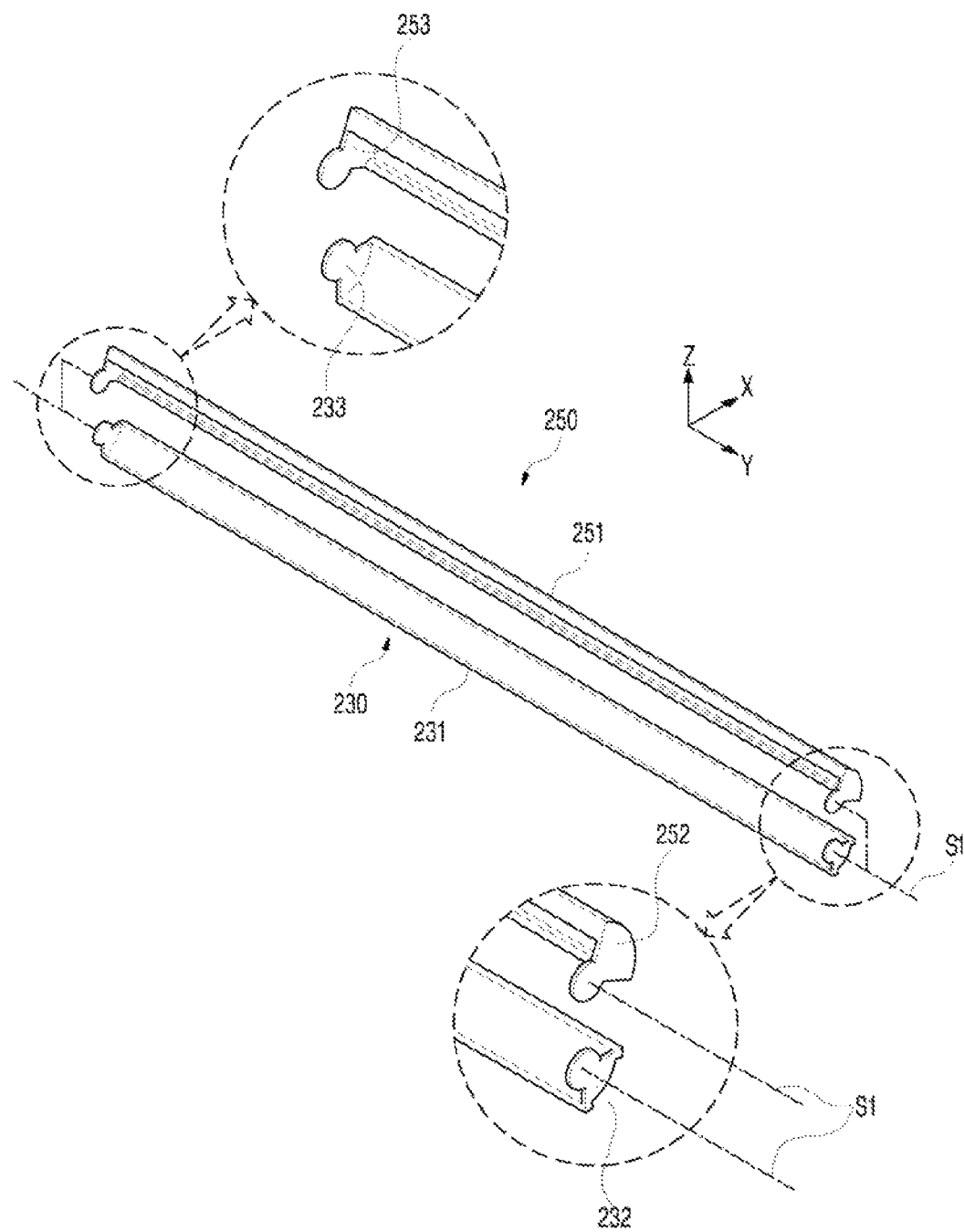
FIG. 15 is an exploded perspective view illustrating the first protective guard and an extended protective guard in a flexible display device according to still another embodiment of the present disclosure.
Figure 16A:
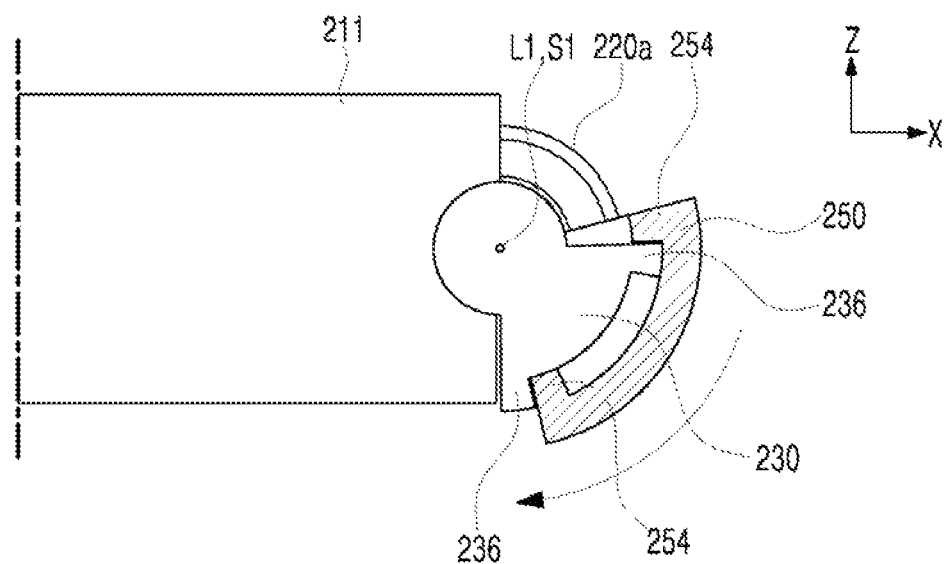
FIG. 16A is a view illustrating the configuration in which the first protective guard and the extended protective guard shown in FIG. 15 are coupled to the flexible display device, in which the extended protective guard is illustrated in a cross-sectional manner.
Figure 16B:
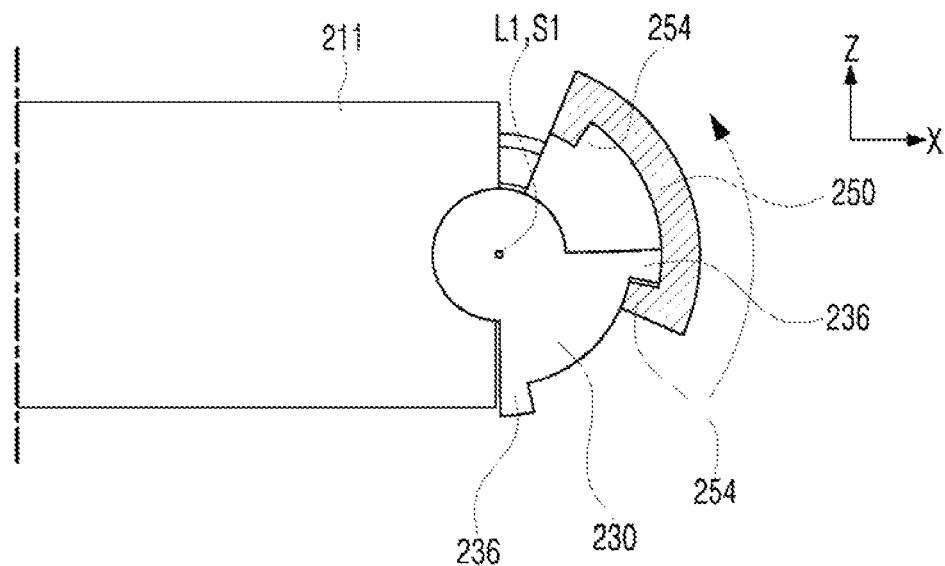
FIG. 16B is a view illustrating the state in which the shape of the flexible display device shown in FIG. 16A is varied.

Next, FIG. 15 is an exploded perspective view illustrating the first protective guard 230 and an extended protective guard 250 in the flexible display device 200 according to still another embodiment of the present disclosure, FIG. 16A is a view illustrating the configuration in which the first protective guard 230 and the extended protective guard 250 shown in FIG. 15 are coupled to the flexible display device 200, and FIG. 16B is a view illustrating the state in which the shape of the flexible display device 200 shown in FIG. 16A is varied.

As shown, the flexible display device 200 can include an extended protective guard 250 including an extended protective plate 251, a first extended connection plate 252, and a second extended connection plate 253. In particular, the extended protective plate 251 is formed in the direction parallel to the first curvature center line L1, and is located at the outer side of the flexible display 220. The extended protective plate 251 can also be formed to have a predetermined area, and can be configured to shield a portion of the outer surface of the flexible display 220.

Further, the extended protective plate 251 can be formed to have a uniform cross-section along the first curvature center line L1 and extend along the first curvature center line L1. That is, the longitudinal direction of the extended protective plate 251 can be parallel to the first curvature center line L1.

The extended protective plate 251 can also be formed in a curved shape and have an inner surface (a surface facing the flexible display 220) formed in a curved shape. Also, the extended protective plate 251 connects the first extended connection plate 252 and the second extended connection plate 253 to each other. The first extended connection plate 252 and the second extended connection plate 253 are portions that are respectively connected to the two opposite end portions of the extended protective plate 251.

In addition, first extended connection plate 252 can be formed to be bent at one end portion of the extended protective plate 251 and be formed to be bent at the opposite end portion of the extended protective plate 251. Each of the first extended connection plate 252 and the second extended connection plate 253 can be formed in the shape of a plate that forms a surface orthogonal to the first curvature center line L1. The inner surface of each of the first extended connection plate 252 and the second extended connection plate 253 can form a surface orthogonal to the first curvature center line L1.

Each of the first extended connection plate 252 and the second extended connection plate 253 can be formed in a fan shape. The first extended connection plate 252 and the second extended connection plate 253 can be formed to be symmetrical to each other. Also, the extended protective guard 250 can be coupled to the body 210 so as to perform motion (reciprocating motion) relative to the body 210.

The extended protective guard 250 can be coupled to the body 210 so as to perform rotation (reciprocating rotation) relative to the body 210. When the first support portion 213 and the second support portion 214 are provided, the extended protective guard 250 can be coupled to the body 210 so as to perform rotation (reciprocating rotation) relative to the first support portion 213 and the second support portion 214.

Specifically, the first extended connection plate 252 can be coupled to the body 210 so as to be rotatable about the first rotation axis S1. Further, the first extended connection plate 252 can be movably coupled to the first support portion 213. The first extended connection plate 252 can be coupled to the first support portion 213 so as to be rotatable about the first rotation axis S1.

In addition, the second extended connection plate 253 can be coupled to the body 210 so as to be rotatable about the first rotation axis S1. Further, the second extended connection plate 253 can be movably coupled to the second support portion 214. The second extended connection plate 253 can be coupled to the second support portion 214 so as to be rotatable about the first rotation axis S1.

In addition, the extended protective guard 250, which is movable (rotatable) relative to the first support portion 213 and the second support portion 214, can function as a protective structure for protecting the flexible display 220, and can shield or expose at least a portion of the first curved surface portion 220a.

During the use of the flexible display device 200, when it is desired to display an image through the first surface portion 220b and the first curved surface portion 220a and to expose the first surface portion 220b and the first curved surface portion 220a to a user, the first protective guard 230 and the extended protective guard 250 can be rotated relative to the body 210 such that the first protective plate 231 of the first protective guard 230 and the extended protective plate 251 of the extended protective guard 250 are located on the second surface 202 of the flexible display device 200.

In addition, during the use of the flexible display device 200, when no image is displayed through the first curved surface portion 220a or when it is desired to protect the first curved surface portion 220a, the first protective guard 230 and the extended protective guard 250 can be rotated relative to the body 210 such that the first protective plate 231 of the first protective guard 230 and the extended protective plate 251 of the extended protective guard 250 are located directly on the outer side of the first curved surface portion 220a. In this instance, the first protective plate 231 and the second extended protective plate can shield the entirety or a portion of the first curved surface portion 220a.

In addition, the first protective guard 230 and the extended protective guard 250 can be movable relative to each other, and can at least partially overlap each other. The first protective guard 230 can also be provided with a first latching protrusion 236, and the extended protective guard 250 can be provided with a second latching protrusion 254, which is configured to be caught on the first latching protrusion 236.

Further, the first latching protrusion 236 can be formed at each of the two opposite end portions of the first protective guard 230, and the second latching protrusion 254 can be formed at each of the two opposite end portions of the extended protective guard 250. The area of the first curved surface portion 220a, which is shielded by the first protective guard 230 and the extended protective guard 250, can be adjusted by respectively rotating the first protective guard 230 and the extended protective guard 250 relative to the body 210.

Figure 17A:
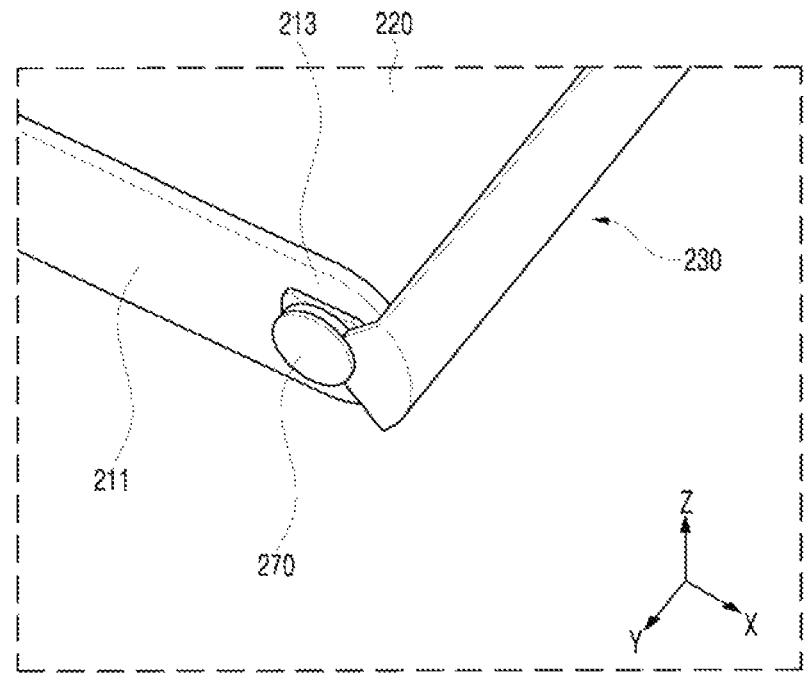
FIG. 17A is a perspective view illustrating a portion of a flexible display device 200 according to still another embodiment of the present disclosure.
Figure 17B:
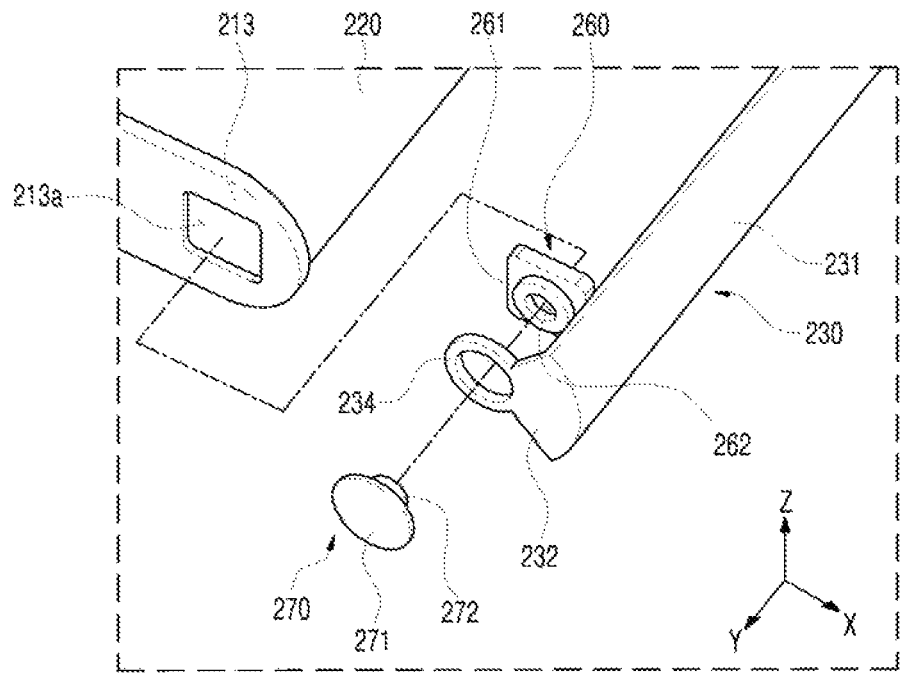
FIG. 17B is an exploded perspective view illustrating the flexible display device shown in FIG. 17A.
Figure 17C:
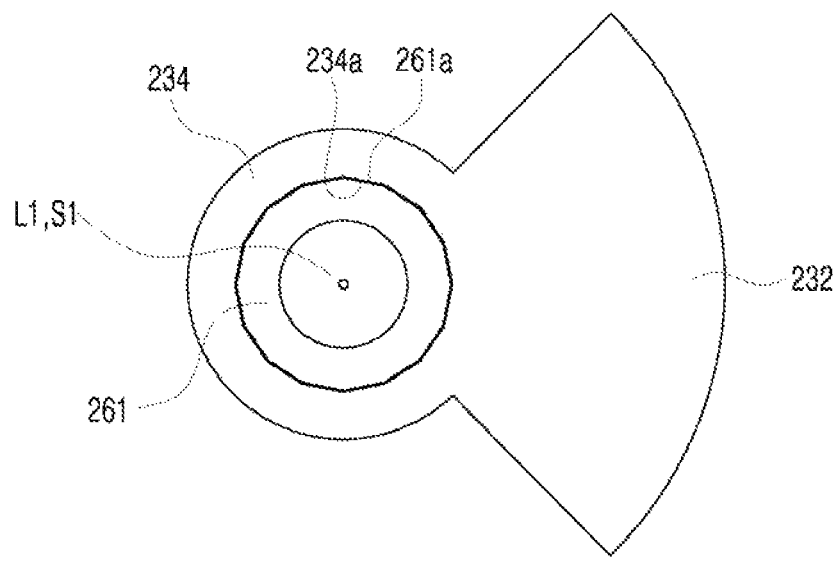
FIG. 17C is a view illustrating the configuration in which a fastening protrusion and a first fastening ring shown in FIG. 17B are coupled to each other.
Figure 18A:
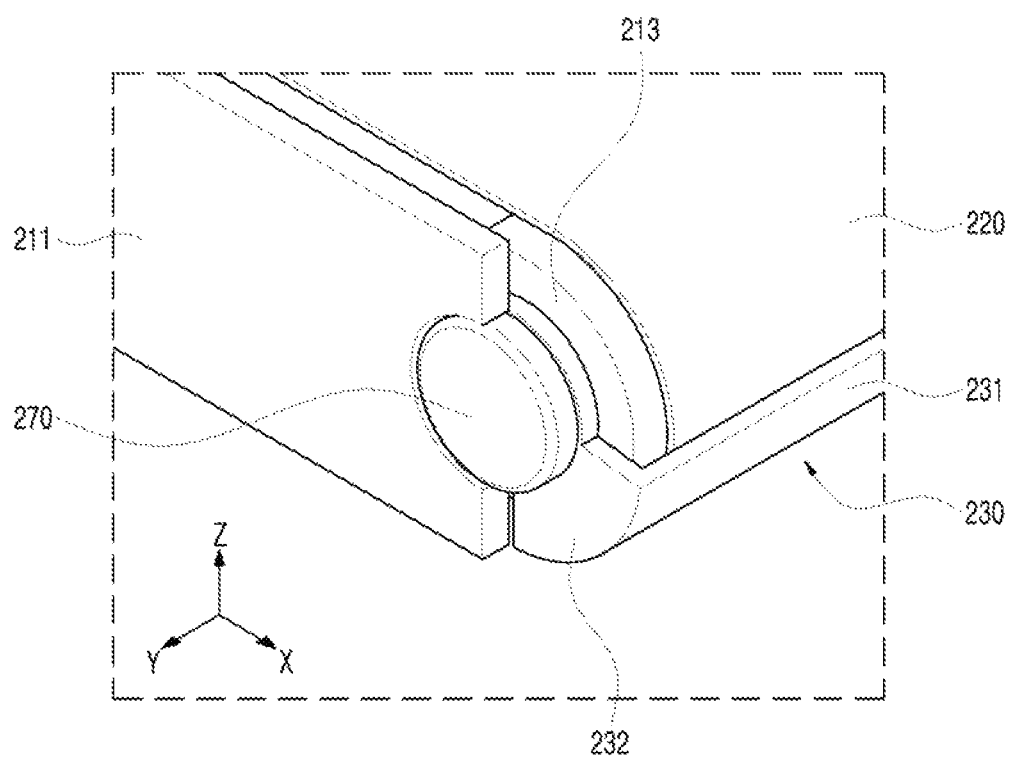
FIG. 18A is a perspective view illustrating a portion of a flexible display device according to still another embodiment of the present disclosure.
Figure 18B:
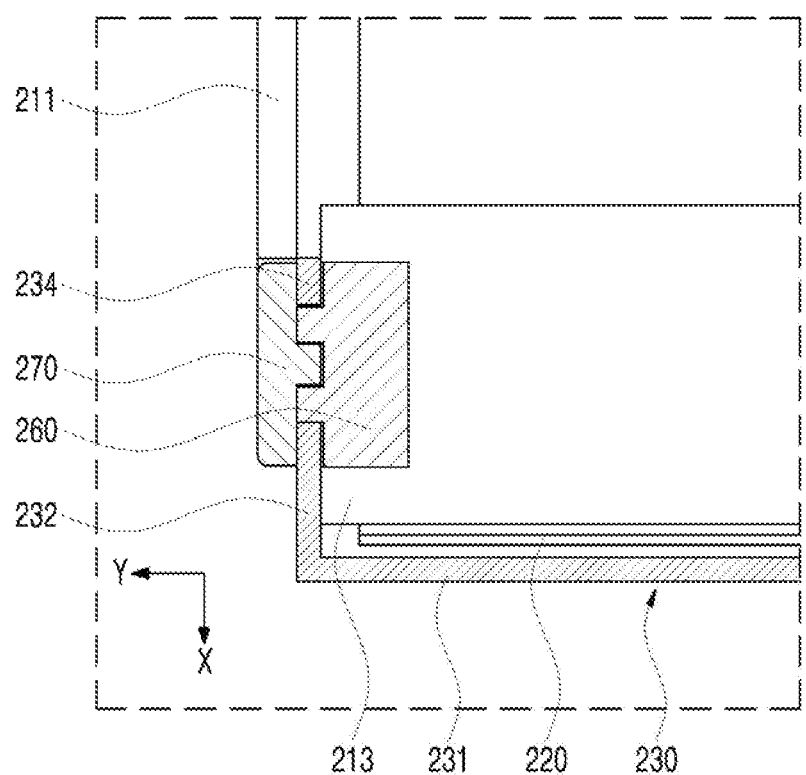
FIG. 18B is a view illustrating cross-sections of some components of the flexible display device shown in FIG. 18A.

Next, FIG. 17A is a perspective view illustrating a portion of the flexible display device 200 according to still another embodiment of the present disclosure, FIG. 17B is an exploded perspective view illustrating the flexible display device 200 shown in FIG. 17A, FIG. 17C is a view illustrating the configuration in which a fastening protrusion and a first fastening ring shown in FIG. 17B are coupled to each other, FIG. 18A is a perspective view illustrating a portion of the flexible display device 200 according to still another embodiment of the present disclosure, and FIG. 18B is a view illustrating cross-sections of some components of the flexible display device 200 shown in FIG. 18A.

Further, the flexible display device 200 can further include a base 260 through which the first support portion 213 and the first connection plate 232 are coupled to each other. The flexible display device 200 can include a plurality of bases 260. The bases 260 can serve to couple the second support portion 214 and the second connection plate 233 to each other, can serve to couple the third support portion 215 and the third connection plate 242 to each other, and can serve to couple the fourth support portion 216 and the fourth connection plate 243 to each other. Any one of the first connection plate 232 or the base 260 can be provided with a fastening protrusion, and the other one can be provided with a first fastening ring into which the fastening protrusion is inserted.

Hereinafter, the configuration in which the fastening protrusion 261 is formed on the base 260 and in which the first fastening ring 234 is formed on the first connection plate 232 will be described by way of example. A second fastening ring 235 can be formed on the second connection plate 233 in order to couple the base 260 and the second connection plate 233 to each other, a third fastening ring 244 can be formed on the third connection plate 242 in order to couple the base 260 and the third connection plate 242 to each other, and a fourth fastening ring 245 can be formed on the fourth connection plate 243 in order to couple the base 260 and the fourth connection plate 243 to each other (see FIGS. 8 and 9).

The base 260 can be detachably coupled to the outer surface of the first support portion 213. The base 260 is configured not to rotate relative to the first support portion 213 in the state of being coupled to the first support portion 213. That is, the base 260 is configured not to rotate about the first rotation axis S1.

A concave seating recess 213a, in which the base 260 is inserted, is formed in the outer surface of the first support portion 213. The base 260 can be perfectly or tightly fitted into the seating recess 213a. The seating recess 213a is formed in a shape corresponding to the shape of the base 260. In the state in which the base 260 is inserted in the seating recess 213a, the base 260 is prevented from rotating relative to the first support portion 213. Thus, the base 260 and the seating recess 213a can be formed in any of various shapes other than a circular shape. For example, the base 260 and the seating recess 213*a* can be formed in a polygonal shape, an elliptical shape, or the like.

As shown in FIG. 17B, the base 260 and the seating recess 213*a* can be formed in a rectangular shape. The fastening protrusion 261 is formed to protrude outward from the outer surface of the base 260. The fastening protrusion 261 can protrude along the first rotation axis S1, and can have a uniform cross-section along the first rotation axis S1.

In addition, the first fastening ring 234 is formed in the shape of a circular ring that has a through-hole formed in the center portion thereof. The fastening protrusion 261 is inserted into the center of the first fastening ring 234. In the state in which the fastening protrusion 261 is inserted into the center of the first fastening ring 234, the first fastening ring 234 and the fastening protrusion 261 at least partially contact each other.

Further, the first fastening ring 234 has an inner circumferential surface that has a size and a shape corresponding to those of the outer circumferential surface of the fastening protrusion 261. That is, in the state in which the fastening protrusion 261 is inserted into the first fastening ring 234, when no external force is applied thereto, the base 260 and the first protective guard 230 (the first connection plate 232) do not rotate relative to each other.

In addition, the outer circumferential surface 261*a* of the fastening protrusion 261 and the inner circumferential surface 234*a* of the first fastening ring 234 can be formed in a polygonal shape (refer to FIG. 17C). Further, the fastening protrusion 261 and the first fastening ring 234 can be made of an elastically deformable material. For example, at least one of the fastening protrusion 261 or the first fastening ring 234 can be made of an elastically deformable material such as plastic.

When each of the outer circumferential surface 261*a* of the fastening protrusion 261 and the inner circumferential surface 234*a* of the first fastening ring 234 is formed in the shape of a polygon having n sides, the first protective guard 230 (the first connection plate 232) can be rotated relative to the base 260 to an angle of 360°/n (or a multiple thereof) by external force applied thereto.

Further, the flexible display device 200 can include a cap 270. The cap 270 can include a flange 271 and a fixing protrusion 272. The cap 270 is disposed on the outer side of the first connection plate 232, and is coupled to the base 260 in order to prevent the first connection plate 232 from being separated from the base 260.

In addition, the flange 271 is formed in the shape of a plate that has a diameter larger than the inner diameter of the first fastening ring 234. The fixing protrusion 272 protrudes from the center of the inner surface of the flange 271, and is attached to and detached from the fastening protrusion 261. The fastening protrusion 261 of the base 260 can have a fixing recess 262 formed therein, into which the fixing protrusion 272 is inserted. The fixing protrusion 272 can be tightly fitted into the fixing recess 262.

As described above, in the flexible display device 200 according to the embodiment of the present disclosure, which includes the base 260 and the cap 270, it is possible to easily install or separate the first protective guard 230 to or from the flexible display device 200 by assembling or disassembling the base 260, the first connection plate 232, and the cap 270 with or from each other.

Figure 19A:
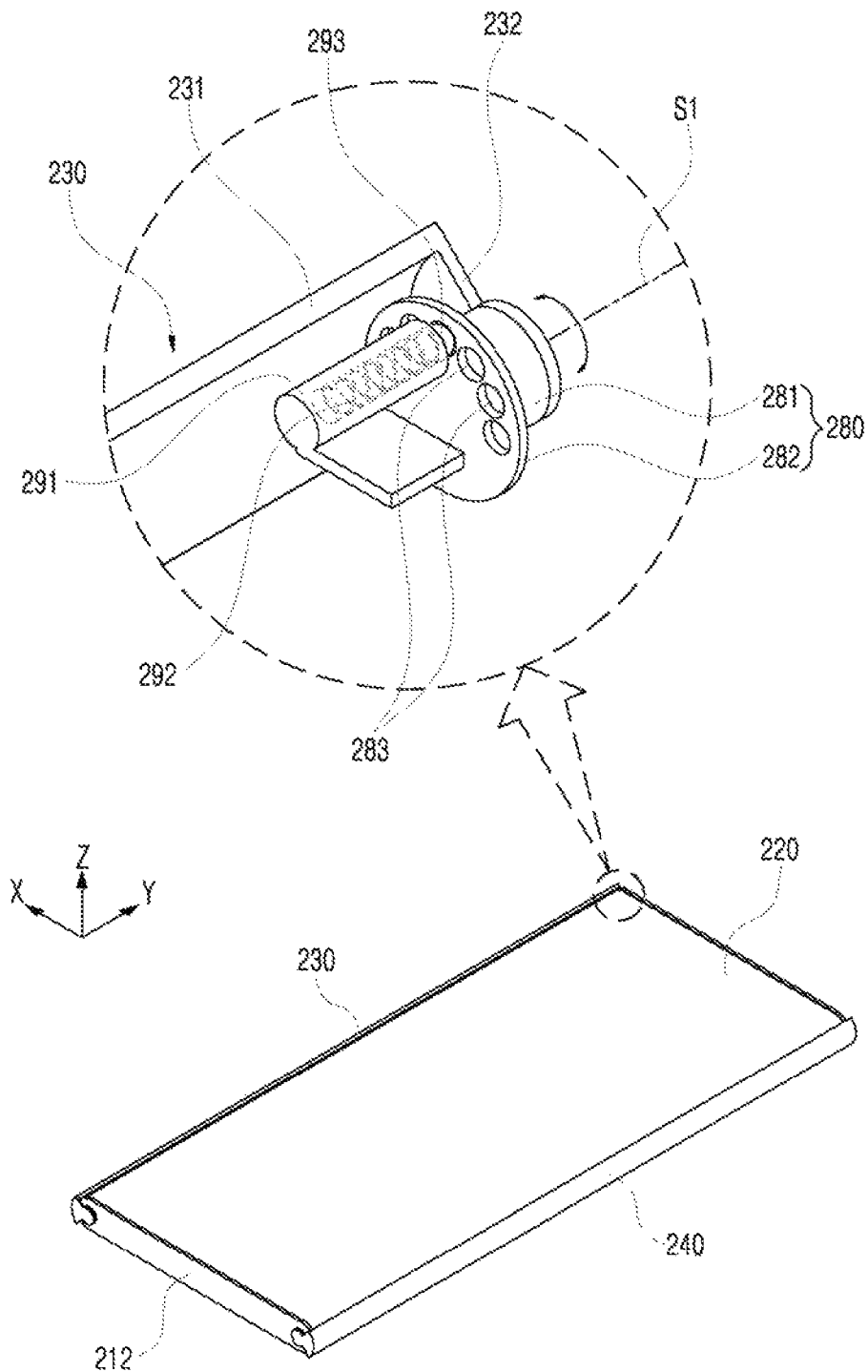
FIG. 19A is a perspective view illustrating a flexible display device according to still another embodiment of the present disclosure, in which some internal components of the flexible display device are illustrated in an enlarged manner.
Figure 19B:
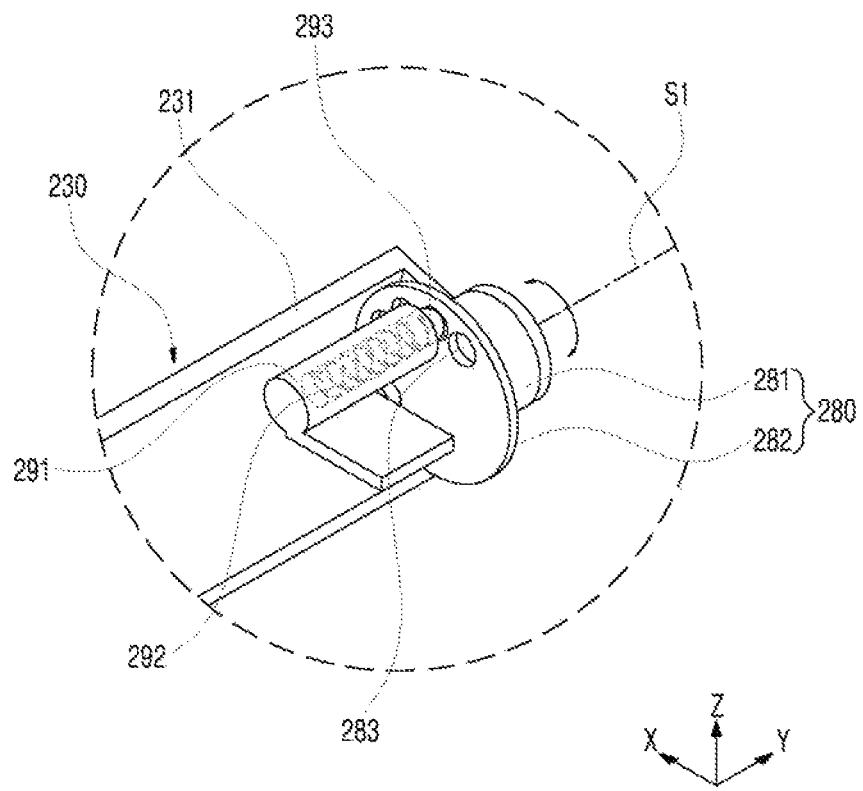
FIG. 19B is a view illustrating the state in which the shape of the flexible display device shown in FIG. 19A is varied.

Next, FIG. 19A is a perspective view illustrating the flexible display device 200 according to still another embodiment of the present disclosure, and FIG. 19B is a view illustrating the state in which the shape of the flexible display device 200 shown in FIG. 19A is varied. The flexible display device 200 can include a rotary body 280, a stop ball 293, an elastic body 292, and a cylinder 291.

The rotary body 280 can include a neck portion 281 and a head portion 282. The neck portion 281 is secured to the first connection plate 232 and extends inward along the first rotation axis S1.

In addition, the head portion 282 can be formed so as to expand in diameter from the inner end of the neck portion 281. The head portion 282 can have a concave stop recess 283 formed therein. The stop recess 283 can be formed in a hemispherical shape. The stop recess 283 can be provided in a plural number, and the plurality of stop recesses 283 can be arranged in the circumferential direction about the first rotation axis S1.

The stop ball 293 can be formed in a spherical shape, and can be inserted into any one of the stop recesses 283. The elastic body 292 is configured to elastically support the stop ball 293 in the direction in which the stop ball 293 is inserted into any one of the stop recesses 283 (the Y-direction). The elastic body 292 can be formed in a coil spring shape.

Further, the cylinder 291 can be secured to the interior of the body 210, and can have an accommodation space formed therein. The accommodation space can extend in the direction parallel to the first rotation axis S1, and can be open toward the head portion 282.

In addition, the elastic body 292 is accommodated in the accommodation space in the cylinder 291. The elastic body 292 is elastically deformed in the accommodation space. The stop ball 293 is elastically supported by the elastic body 292 in the state in which at least a portion thereof is inserted into the accommodation space.

When no external force is applied thereto, the stop ball 293 is maintained in the state of being inserted into any one of the stop recesses 283 by the elastic body 292. Accordingly, the first protective guard 230 is prevented from rotating relative to the body 210 and the cylinder 291.

When the first protective guard 230 is rotated relative to the body 210 and the cylinder 291 by external force applied thereto, the rotary body 280 rotates, and accordingly the stop ball 293 escapes from one of the stop recesses 283, in which the stop ball 293 has been received, and is inserted into a neighboring one of the stop recesses 283. When the external force is removed, the rotation of the first protective guard 230 relative to the body 210 and the cylinder 291 is stopped. As such, the position of the first protective guard 230 can be fixed so as to shield a specific region of the flexible display 220, and can also be easily changed.

Figure 20A:
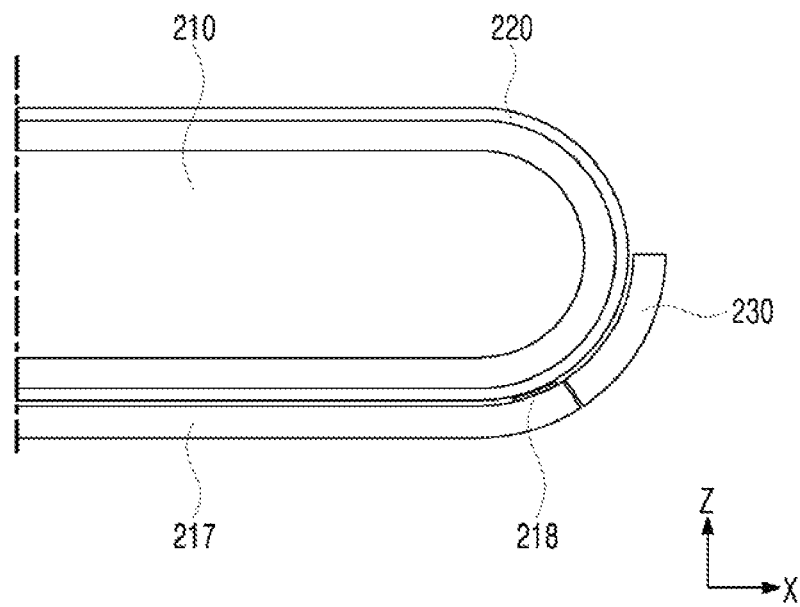
FIG. 20A is a cross-sectional view illustrating some components of a flexible display device according to still another embodiment of the present disclosure.
Figure 20B:
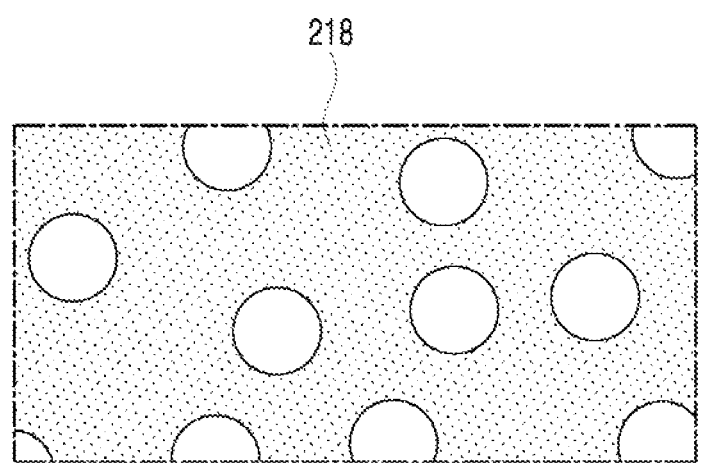
FIGS. 20B and 20C are views schematically illustrating a portion of a first filter according to an embodiment of the present disclosure.
Figure 20C:
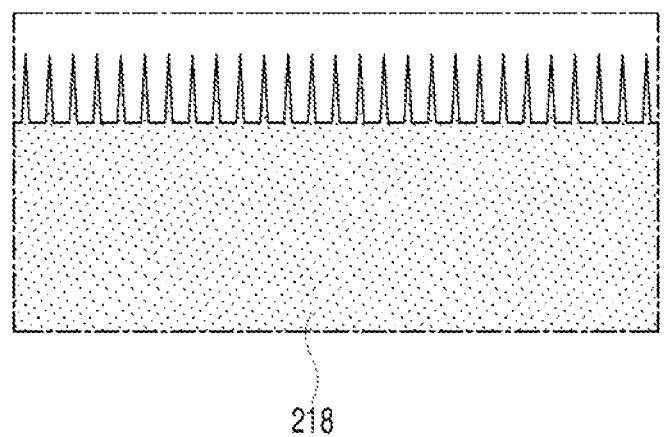
Figure 21:
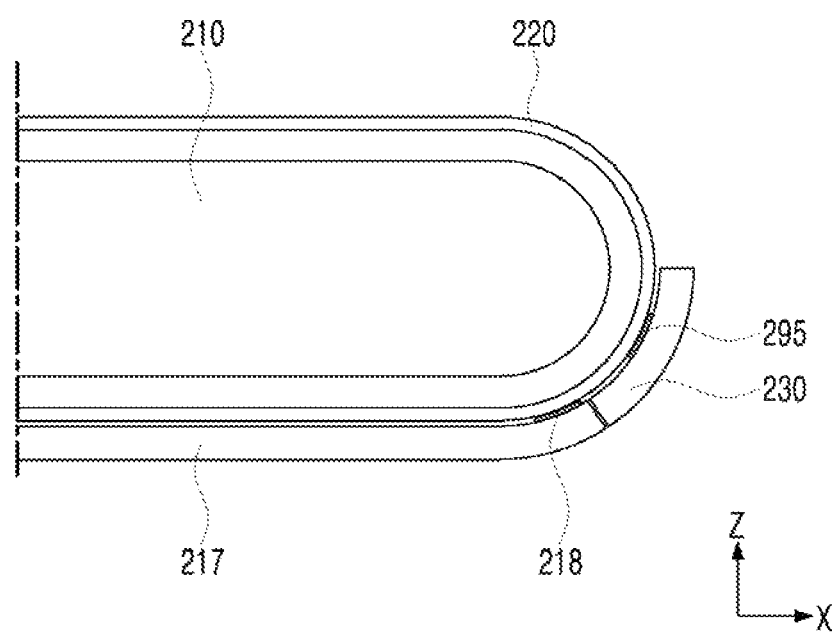
FIG. 21 is a cross-sectional view illustrating some components of a flexible display device according to still another embodiment of the present disclosure.

Next, FIG. 20A is a cross-sectional view illustrating some components of the flexible display device 200 according to still another embodiment of the present disclosure, FIGS. 20B and 20C are views schematically illustrating a portion of a first filter 218 according to an embodiment of the present disclosure, and FIG. 21 is a cross-sectional view illustrating some components of the flexible display device 200 according to still another embodiment of the present disclosure.

In addition, the flexible display device 200 can include a back cover 217 and a first filter 218. The back cover 217 can be formed in a flat plate shape overall, and can be fixed to the body 210. The back cover 217 can form the entirety or a portion of the second surface 202 of the flexible display device 200.

The back cover 217 can be configured to shield the second surface portion 220*c* of the flexible display 220 while being spaced apart therefrom. The first filter 218 can be made of a soft material. The first filter 218 can include at least one of a brush, a cloth, a nonwoven fabric, a sponge, or paper (see FIGS. 20B and 20C).

Further, the first filter 218 can extend in the direction parallel to the first curvature center line L1. The first filter 218 can be formed over the entire area of the flexible display 220 in the direction parallel to the first curvature center line L1. That is, the first filter 218 can have a length that is equal to the length of the flexible display 220 in the direction parallel to the first curvature center line L1.

In addition, the first filter 218 is coupled to the inner surface of the back cover 217 so as to be in contact with the flexible display 220. The first filter 218 prevents foreign substances such as dust from entering the region between the second surface portion 220c of the flexible display 220 and the back cover 217.

The flexible display device 200 can include a second filter 295. The second filter 295 can be made of a soft material. The second filter 295 can include at least one of a brush, a cloth, a nonwoven fabric, a sponge, or paper.

Further, the second filter 295 can extend in the direction parallel to the first curvature center line L1. The second filter 295 can be formed over the entire area of the flexible display 220 in the direction parallel to the first curvature center line L1. That is, the second filter 295 can have a length that is equal to the length of the flexible display 220 in the direction parallel to the first curvature center line L1.

In addition, the second filter 295 is coupled to the inner surface of the first protective plate 231 of the first protective guard 230 so as to be in contact with the flexible display 220. The second filter 295 can remove foreign substances such as dust from the outer surface of the flexible display 220, on which the first protective guard 230 moves relative thereto.

While the specific exemplary embodiments of the present disclosure have been described above and illustrated, it will be understood by those skilled in the art that the present disclosure is not limited to the described exemplary embodiments, and various modifications and alterations can be made without departing from the spirit and the scope of the present disclosure. Therefore, the scope of the present disclosure is not limited to the above-described exemplary embodiments, but shall be defined by the technical thought as recited in the following claims.

Further, a first curved surface portion can be protected by a first protective guard, and can thus be prevented from being undesirably touched by an external object. Further, the first curved surface portion can be exposed to the outside by rotating the first protective guard relative to a body. As a result, the present disclosure has high industrial applicability.

What is claimed is:

1. A flexible display device, comprising:
   a body;
   a flexible display exposed to an outside of the body and including a first curved surface portion curved about a first curvature center line and a first surface portion extending from the first curved surface portion, the first surface portion being disposed on a front surface of the body;
   a first support portion and a second support portion disposed on opposite sides of the flexible display in a direction parallel to the first curvature center line; and
   a first protective guard moveably coupled to the first and second support portions and protecting the first curved surface portion of the flexible display.

2. The flexible display device according to claim 1, wherein the first support portion and the second support portion are symmetrical disposed at positions further outward than opposite edges of the flexible display, and
   wherein a vertical distance from the first curvature center line to an edge of the first support portion is greater than a radius of curvature of the first curved surface portion.

3. The flexible display device according to claim 1, wherein the first protective guard is coupled to the first support portion and the second support portion so as to be rotatable about a first rotation axis, and
   wherein the first rotation axis is formed in a same line as the first curvature center line.

4. The flexible display device according to claim 3, wherein the first protective plate comprises a curved inner surface concentric with the first curved surface portion.

5. The flexible display device according to claim 3, wherein the first curved surface portion forms a 180° angle about the first curvature center line, and
   wherein the first protective plate forms an angle within a range from 30° to 120° about the first rotation axis.

6. The flexible display device according to claim 1, further comprising:
   an extended protective guard moveably coupled to the first protective guard and protecting the first curved surface portion of the flexible display.

7. The flexible display device according to claim 6, wherein the first protective guard and the extended protective guard are coupled to the first support portion and the second support portion so as to be rotatable about a first rotation axis,
   wherein the first protective guard includes a first latching protrusion, and
   wherein the extended protective guard includes a second latching protrusion configured to be caught on the first latching protrusion.

8. The flexible display device according to claim 1, wherein the flexible display further comprises a second surface portion opposite the first surface portion,
   wherein the flexible display device further comprises a first plate and a second plate respectively disposed at positions further outward than opposite edges of each of the first surface portion and the second surface portion in a direction parallel to the first curvature center line, and
   wherein the first plate and the second plate protrude further outward than the first surface portion and the second surface portion in a direction orthogonal to surfaces of the first surface portion and the second surface portion.

9. The flexible display device according to claim 1, further comprising:
   a base through which the first support portion and a first connection plate of the first protective guard are coupled to each other,
   wherein any one of the first connection plate or the base includes a fastening protrusion, and a remaining one of the first connection plate or the base includes a first fastening ring into which the fastening protrusion is inserted, and
   wherein an outer circumferential surface of the fastening protrusion and an inner circumferential surface of the first fastening ring, configured to at least partially contact each other, have a polygonal shape.

10. The flexible display device according to claim 9, wherein the fastening protrusion is formed at the base, and the first fastening ring is formed at the first connection plate, wherein the first support portion includes a seating recess formed in an outer surface of the first support portion, into which the base is detachably inserted, and wherein the flexible display device further comprises a cap including a flange having a diameter larger than an inner diameter of the first fastening ring and a fixing protrusion protruding from a center of the flange to be attached to and detached from the fastening protrusion.

11. The flexible display device according to claim 1, wherein the first protective guard is coupled to the first support potion and the second support portion so as to be rotatable about a first rotation axis, and wherein the flexible display device further comprises:
a rotary body including a neck portion secured to a first connection plate of the first protective guard and extending inward along the first rotation axis, and a head portion expanding in diameter from an inner end of the neck portion, the head portion including a plurality of concave stop recesses arranged in a circumferential direction about the first rotation axis;
a stop ball configured to be inserted into any one of the stop recesses;
an elastic body configured to elastically support the stop ball such that the stop ball is inserted into any one of the stop recesses; and
a cylinder coupled to an interior of the body, and configured to accommodate and support the stop ball and the elastic body.

12. The flexible display device according to claim 1, wherein the flexible display further comprises a second curved surface portion curved about a second curvature center line parallel to the first curvature center line, the second curved surface portion being convex in a direction opposite the first curved surface portion, and wherein the flexible display device further comprises:
a third support portion and a fourth support portion disposed on opposite sides of the flexible display in a direction parallel to the second curvature center line; and
a second protective guard moveably coupled to the third and fourth support portions and protecting the second curved surface portion of the flexible display.

13. A flexible display device, comprising:
a body;
a flexible display exposed to an outside of the body and including a first curved surface portion curved about a first curvature center line and a first surface portion extending from the first curved surface portion, the first surface portion being disposed on a front surface of the body; and
a first protective guard including a first protective plate disposed outside the flexible display and extending in a direction parallel to the first curvature center line, a first connection plate, and a second connection plate, the first connection plate and the second connection plate being respectively bent at opposite end portions of the first protective plate and coupled to the body so as to be rotatable about a first rotation axis,
wherein the first protective guard rotates relative to the body to shield or expose at least a portion of the first curved surface portion.

14. The flexible display device according to claim 13, wherein the first protective plate includes a curved inner surface concentric with the first curved surface portion.

15. The flexible display device according to claim 13, wherein the first curved surface portion forms a 180° angle about the first curvature center line, and wherein the first protective plate forms an angle within a range from 30° to 120° about the first rotation axis.

16. The flexible display device according to claim 13, further comprising:
an extended protective guard including an extended protective plate disposed outside the flexible display and extending in a direction parallel to the first curvature center line, a first extended connection plate, and a second extended connection plate, the first extended connection plate and the second extended connection plate being formed to be respectively bent at opposite end portions of the extended protective plate and coupled to the body so as to be rotatable about the first rotation axis,
wherein the extended protective guard rotates relative to the body to shield or expose at least a portion of the first curved surface portion, and
wherein the first protective guard and the extended protective guard are rotatable relative to each other, and at least partially overlap each other.

17. The flexible display device according to claim 16, wherein the first protective guard includes a first latching protrusion, and
wherein the extended protective guard includes a second latching protrusion configured to be caught on the first latching protrusion.

18. The flexible display device according to claim 13, wherein the flexible display further comprises a second curved surface portion curved about a second curvature center line parallel to the first curvature center line, the second curved surface portion being convex in a direction opposite the first curved surface portion, and
wherein the flexible display device further comprises a second protective guard including a second protective plate disposed outside the flexible display and extending in a direction parallel to the second curvature center line, a third connection plate, and a fourth connection plate, the third connection plate and the fourth connection plate being formed to be respectively bent at opposite end portions of the second protective plate and coupled to the body so as to be rotatable about a second rotation axis.

19. The flexible display device according to claim 13, wherein the flexible display further comprises a second surface portion opposite the first surface portion, the second surface portion extending from the first curved surface portion, and
wherein the flexible display device further comprises:
a back cover configured to shield the second surface portion while being spaced apart from the second surface portion; and
a first filter coupled to an inner surface of the back cover so as to be in contact with the flexible display, the first filter including at least one of a brush, a cloth, a nonwoven fabric, a sponge, or paper.

20. The flexible display device according to claim 19, further comprising:
a second filter coupled to an inner surface of the first protective guard so as to be in contact with the flexible display, the second filter including at least one of a brush, a cloth, a nonwoven fabric, a sponge, or paper.

* * * * *